(12) United States Patent
Nicholls et al.

(10) Patent No.: US 6,297,704 B1
(45) Date of Patent: Oct. 2, 2001

(54) OSCILLATION CIRCUITS FEATURING COAXIAL RESONATORS

(75) Inventors: Charles Tremlett Nicholls, Nepean; Johan M. Grundlingh, Kinburn, both of (CA)

(73) Assignee: Nortel Networks Corporation, Montreal (CA)

( * ) Notice: Subject to any disclaimer, the term of this patent is extended or adjusted under 35 U.S.C. 154(b) by 0 days.

(21) Appl. No.: 09/471,140

(22) Filed: Dec. 23, 1999

Related U.S. Application Data

(63) Continuation-in-part of application No. 09/409,989, filed on Sep. 30, 1999.

(51) Int. Cl.[7] ............................. H03B 5/18; H03L 7/099
(52) U.S. Cl. .............................. 331/34; 331/57; 331/101; 331/117 D; 331/177 R; 331/177 V; 331/50; 333/219.1; 333/222
(58) Field of Search .................... 331/34, 96, 101, 331/117 D, 177 R, 177 V, 57, 50; 333/206, 219.1, 222

(56) References Cited

U.S. PATENT DOCUMENTS

| | | | |
|---|---|---|---|
| 4,223,287 | * 9/1980 | Nishikawa et al. | ............... 333/207 |
| 5,175,520 | * 12/1992 | Inoue | ............... 333/222 |
| 5,508,665 | * 4/1996 | Chan et al. | ............... 331/101 |
| 5,613,231 | * 3/1997 | Morey | ............... 331/107 DP |

* cited by examiner

Primary Examiner—Siegfried H. Grimm

(57) ABSTRACT

There is a manufacturing limit on how small ceramic coaxial resonators can be produced, which leads to a limit on the frequency of resonance for these resonators. One technique to quadruple the effective frequency of a ceramic coaxial resonator is to couple four resonators into a ring configuration, each of the resonators having an electrical length of 90°. Further, each of the resonators has an amplifier coupled in parallel, these amplifiers having phase shifts approximately equal to 90° and further being controlled by a tuning voltage $V_{TUNE}$. In operation, four oscillation signals are generated at the same frequency but out-of-phase by a factor of 90°. When combined, the resulting signal is an oscillation signal at four times the frequency of the original oscillation signals. At the same time, one of the oscillation signals used in the combination can be sampled and be used for feedback purposes within a PLL-FS. Overall, this increase in output frequency along with low frequency sampling capability for feedback, can reduce the need for frequency multiplication and division within a PLL-FS.

27 Claims, 16 Drawing Sheets

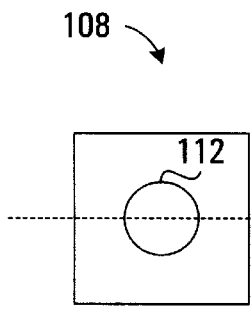
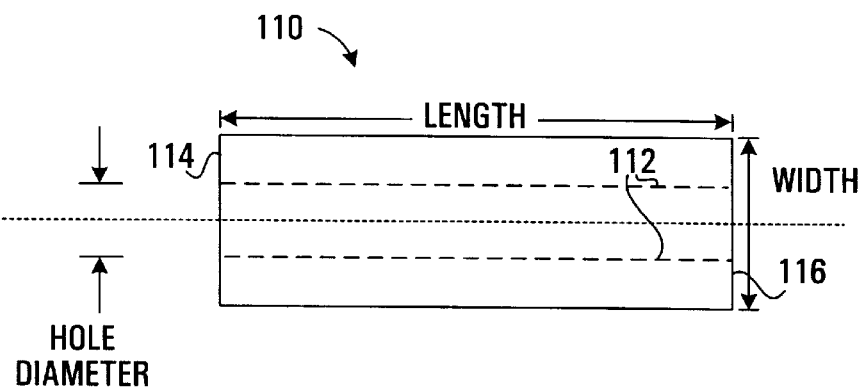
FIG. 6A  FIG. 6B
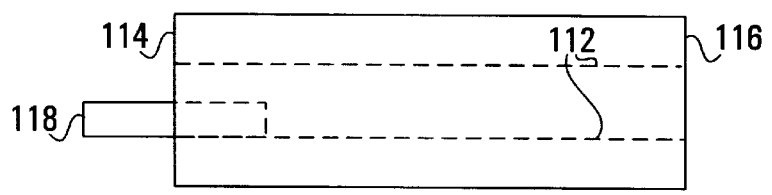
FIG. 6C
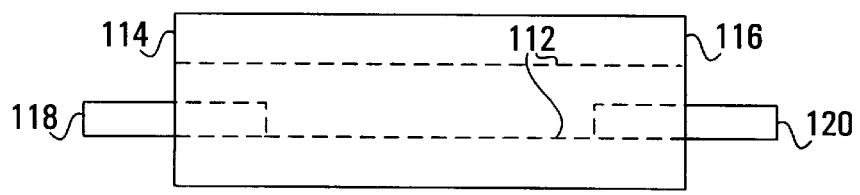
FIG. 6D

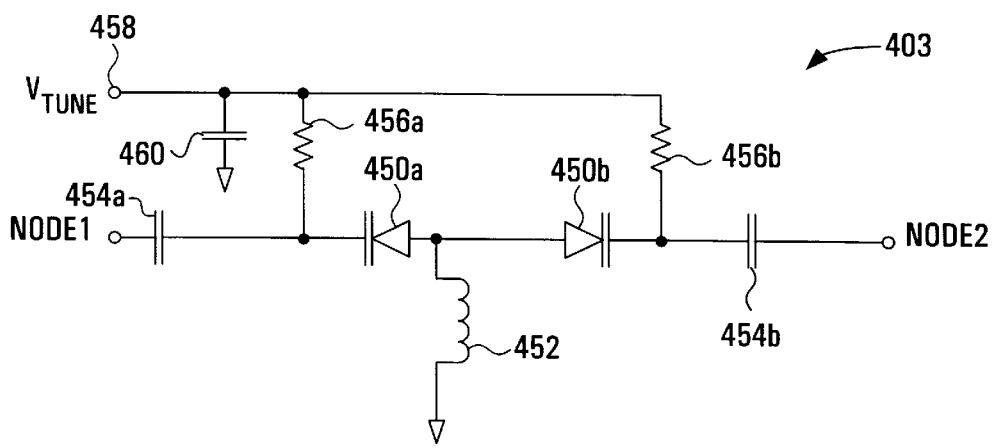
FIG. 12
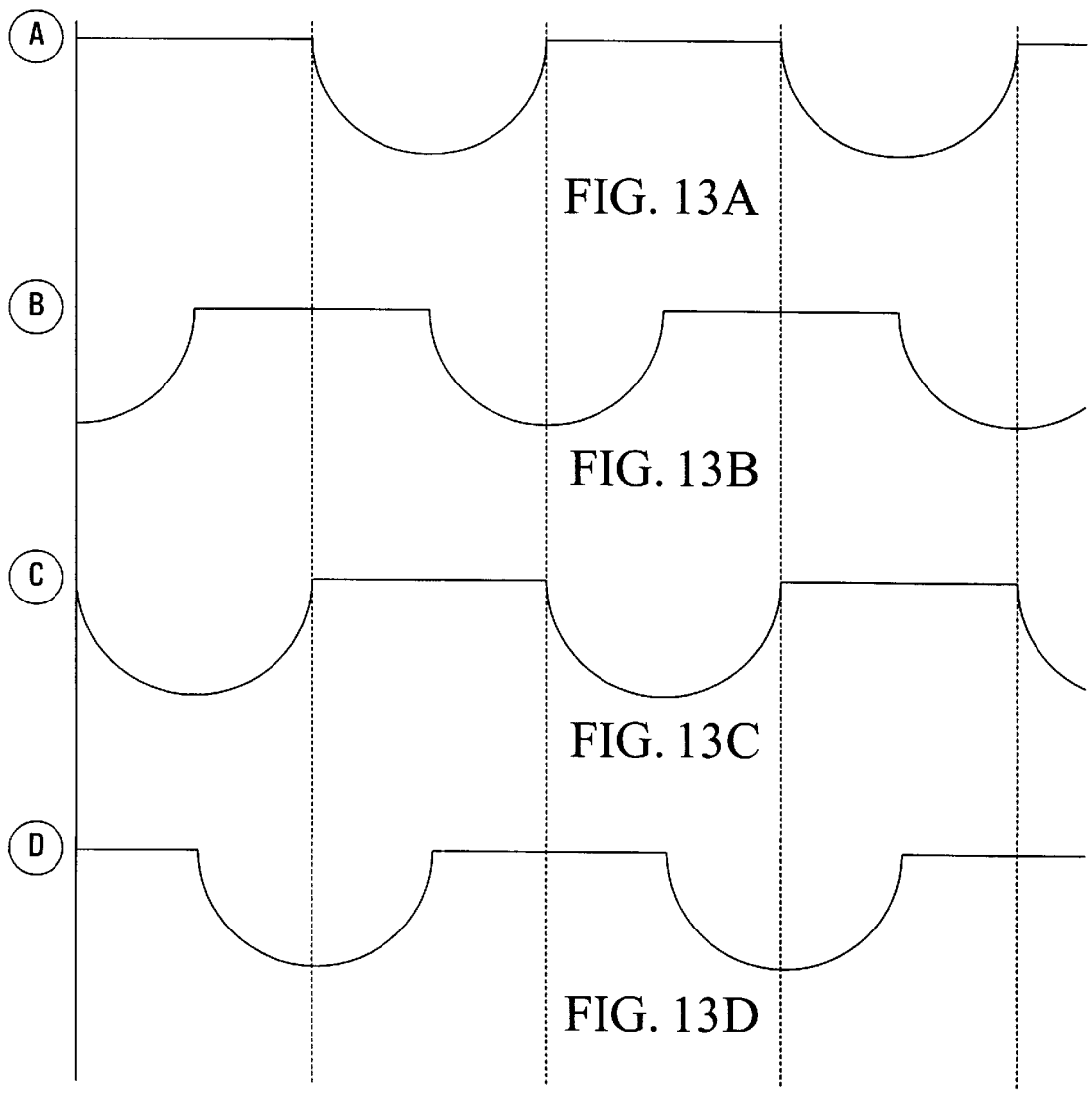
FIG. 13A
FIG. 13B
FIG. 13C
FIG. 13D

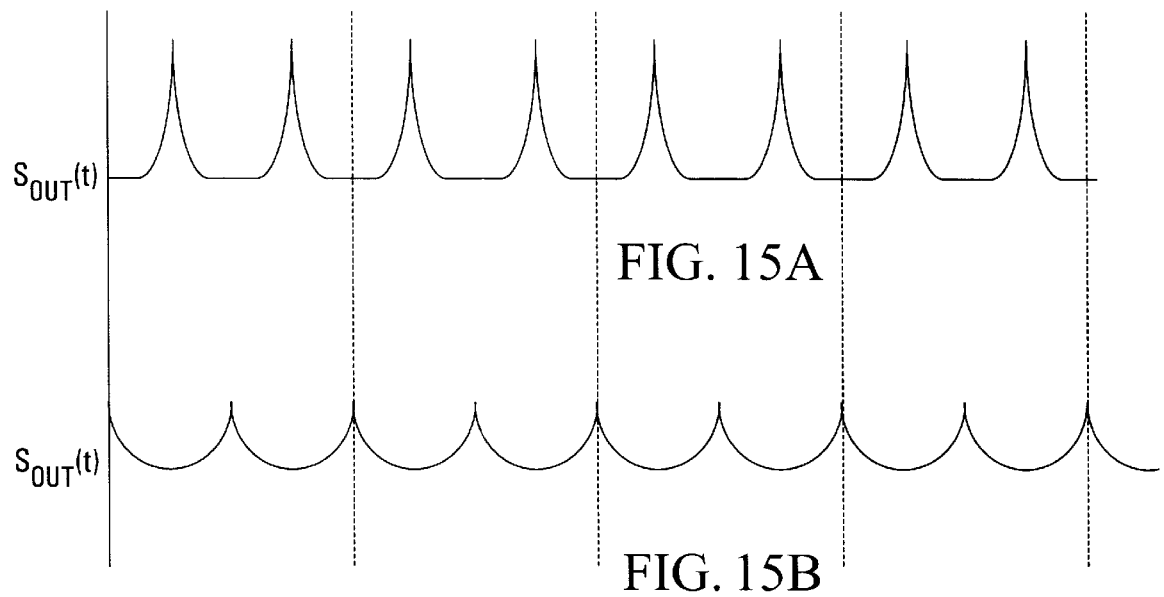

OSCILLATION CIRCUITS FEATURING COAXIAL RESONATORS

This application is a Continuation-in-Part of copending application Ser. No. 09/409,989 entitled "Coaxial Resonators and Oscillation Circuits Featuring Coaxial Resonators", filed on Sep. 30, 1999 by the inventors of the present application and assigned to the assignee of the present application.

FIELD OF THE INVENTION

This invention relates generally to coaxial resonators and more specifically to modifications within coaxial resonator oscillation circuit designs.

BACKGROUND OF THE INVENTION

Oscillators are required within many different technology areas, especially within the expanding communication industry. In communication applications, oscillators are commonly used to generate carrier signals at specific frequencies on which information signals are subsequently modulated. For instance, a Voltage Controlled Oscillator (VCO) within a Personal Communication System (PCS) would typically be tuned around 1900 MHz.

FIG. 1 is a block diagram illustrating a typical Phase Locked Loop-Frequency Synthesizer (PLL-FS) that is a standard implementation for a VCO within a communication apparatus. In the case shown in FIG. 1, the PLL-FS includes a crystal reference oscillator 20, in this case operating at 8 MHz, coupled in series with a first frequency divider 22, a phase detector 24, a loop filter 26, a VCO in the form of a Voltage Controlled-Coaxial Resonator Oscillator (VC-CRO) 28, a coupler 30 that generates a sample of the signal output from the VC-CRO 28, and an amplifier 32 that outputs a signal $S_{OUT}(t)$. Further, the PLL-FS includes a phase feedback path comprising a second frequency divider 36 coupled between the coupler 30 and the phase detector 24.

Within the block diagram of FIG. 1, the crystal reference oscillator 20 outputs a crystal reference signal at 8 MHz that is subsequently frequency divided down to 160 KHz by the first frequency divider 22. The phase detector 24 receives the divided crystal reference signal and compares its phase with a feedback signal, the generation of the feedback signal being described herein below. The output of the phase detector 24 is a baseband signal, the amplitude of which is proportional to the phase difference between the two signals input to the phase detector 24, along with comparison frequency spurs at integer multiples of 160 KHz. The loop filter 26 (that could be either passive or active) receives the output from the phase detector 24 and removes the spurs within the signal by rejecting the components at multiples (n×160 KHz) of the comparison frequency (160 KHz), leaving only the baseband signal. This filtered result is fed as a control voltage into a tuning port 34 of the VC-CRO 28, the frequency of which is controlled with a varactor diode arrangement (not shown). The VC-CRO 28 in this case comprises a Colpitts oscillator stabilized with a ceramic coaxial resonator that creates a signal at an oscillation frequency based upon the frequency of resonance of the particular resonator used and the control voltage applied at the tuning port 34. The oscillation frequency is normally slightly less than that of the frequency of resonance (typically between 200 MHz and 5 GHz). The high frequency signal output from the VC-CRO 28 is sampled by the coupler 30 and frequency divided by the second frequency divider 36 to generate the feedback signal input to the phase detector 24. One should understand that the amount the frequency of the feedback signal is divided within the second frequency divider 36 determines the control voltage output from the phase detector 26. This voltage level subsequently determines the oscillation frequency at which the VC-CRO 28 is tuned, with changes in the division factor allowing for step changes in the oscillation frequency. As depicted in FIG. 1, the output from the VC-CRO 28 is received at the amplifier 32 which amplifies the signal and outputs the amplified result as the signal $S_{OUT}(t)$. Overall, the PLL synthesizer architecture enables digital control over the VC-CRO frequency, and also locks the VC-CRO to the reference crystal oscillator which ensures the frequency stability of the source over all system conditions such as temperature, ageing, and mechanical stress.

There are a number of advantages of using a ceramic coaxial resonator to stabilize a VC-CRO within a PLL-FS. These advantages relate to the physical design of a ceramic coaxial resonator. Typically, a ceramic coaxial resonator comprises a ceramic dielectric material formed as a rectangular prism with a coaxial hole running lengthwise through the prism and a electrical connector connected to one end. The outer and inner surfaces of the prism, with the exception of the end connected to the electrical connector and possibly the opposite end, are coated in a metal such as copper or silver. A device formed in this manner essentially forms a resonant RF circuit, including capacitance, inductance, and resistance, that oscillates when in the Transverse Electromagnetic (TEM) mode (as is the case when stabilizing a Colpitts oscillator). The advantages gained with this design include a high Q value (typically approx. 800) and therefore low noise oscillations associated with the resonator as well as temperature stability and resistance to microphonics that characterize a ceramic coaxial resonator. These advantages result in a further important advantage, that being a low cost; currently approximately 65 cents per resonator.

Unfortunately, there is a significant problem with the use of ceramic coaxial resonators as currently designed. The frequency of resonance for a ceramic coaxial resonator has a maximum frequency that can be output due to physical limitations. The frequency of resonance for a ceramic coaxial resonator is based upon the physical size and shape of the particular resonator. Generally, the smaller the size of the resonator, the higher is the frequency of resonance and vice versa. The problem is that ceramic coaxial resonators have a minimum size at which they can be manufactured that limits the frequency of resonance equal to or below a maximum value. This is a physical limit that, as currently designed, limits the output of a typical Coaxial Resonator Oscillator (CRO) using a ceramic coaxial resonator to approximately 5 GHz, whether the CRO is voltage controlled or not.

Up until recently, this 5 GHz limit has not significantly affected the use of ceramic coaxial resonators within VC-CROs or CROs since the frequency of operation of previous communication equipment was typically below this level. For example, PCS equipment operate at approximately 1900 MHz. Currently there are a number of different communication standards that require VCOs with oscillation frequencies higher than 5 GHz. For instance, OC-192 fiber optic signals are transmitted at approximately 10 GHz and the newly developed Local Multi-point Distribution System (LMDS), slated to be used for the Internet over wireless, is set to operate between 28 to 30 GHz. It can be assumed that further developments and standards will be designed that require yet higher oscillation frequencies.

One well-known technique to increase the oscillation frequency of signals within a system using a standard VCO as depicted in FIG. 1 is to use a subharmonically pumped mixer that doubles the oscillation frequency at a stage after the VCO. Unfortunately, even with the use of a subharmonically pumped mixer, a system using the standard VCO that operates with a ceramic coaxial resonator is still limited to a maximum oscillation frequency of 10 GHz which is insufficient for LMDS applications. Hence, techniques are required to increase the oscillation frequency within the actual VCOs.

One technique that has been tried to increase the oscillation frequency output from a PLL-FS as depicted in FIG. 1 beyond the 5 GHz limit is to add a frequency multiplication stage after the amplifier 32. An example of such a multiplication stage is illustrated within FIG. 2. As can be seen, a frequency multiplier 38 is coupled to the output of the amplifier 32 and further coupled in series with a first filter 40, an amplifier 42, and a second filter 44. In this design, the multiplier 38 increases the oscillation frequency of the signal by three times that of the frequency output from the amplifier 32. Hence, if the original frequency of the VCO was 5 GHz, this would allow the resulting system frequency (after using a subharmonically pumped mixer) to be 30 GHz. The filters 40,44 and amplifier 42 are used to reduce the noise spurs and other undesirable characteristics added to the signal as a result of the multiplier 38. One problem with this implementation is the inability of the filters 40,44 and amplifier 42 to completely remove the spurs and undesired mixing products output from the multiplier 38, hence passing on these non-ideal characteristics to further components within the system that use the oscillating signal. Another problem is the typically low efficiency of multipliers, such as multiplier 38, that can lead to high current consumption within the circuit by the multiplier 38. Yet further, the added components 38,40,42,44 also add to the component count and cost for the overall PLL-FS.

Another technique that is used to increase the oscillation frequency being output from a VCO is to replace the standard VC-CRO 28 with an oscillator stabilized with an alternative resonator device to the ceramic coaxial resonator. In one implementation, this alternate oscillator is a Dielectric Resonator Oscillator (DRO) which can allow for frequencies higher than 20 GHz to be output. A DRO typically continues to use a Colpitts oscillator while using a dielectric resonator in place of the ceramic coaxial resonator. Dielectric resonators consist of a puck of dielectric material encased within a cavity. The physical dimensions of the puck set the frequency range for a DRO while the placement of the puck within the cavity is critical to the tuning of the center frequency. One of the key disadvantages of the DRO implementation is the cost of tuning the center frequency. Since the puck of a DRO is sensitive with respect to its location within the cavity, the DRO as a whole is susceptible to microphonics, that being mechanical vibration of the resonator housing. Although the cost of actual parts used in a DRO are low, the possible problems associated with microphonics and frequency centering adds considerable manufacturing costs to a DRO as specially engineered casings are required. This results in a DRO currently costing approximately $500–600. On the other hand, a well-known CRO as described herein above can cost less than $10.

Another alternative implementation for the VCO within FIG. 1 is to replace the VC-CRO 28 stabilized with a ceramic coaxial resonator with a Yttrium Iron Garnet (YIG) stabilized oscillator. These oscillators can operate at sufficiently high frequencies with low noise throughout the tuning bandwidth. Unfortunately, there are a number of unacceptable disadvantages to their use. For one, the tuning of these YIG devices is relatively slow (300 KHz modulation bandwidth versus a typical 2 MHz modulation bandwidth for a VC-CRO) due to the use of an inductor within the tuned circuit. Other disadvantages include the high current consumption of these oscillators and their relatively high cost when compared to the VC-CRO. A minimum cost for a YIG stabilized oscillator is approximately $90. Due to these problems, YIG stabilized oscillators are used seldom in industry except within measurement equipment.

The advantages of using a ceramic coaxial resonator to stabilize an oscillator within a PLL frequency synthesizer are especially apparent when compared to the alternative designs discussed above. The simple design of a ceramic coaxial resonator is not sensitive to microphonics as there are no placement or cavity requirement, unlike the dielectric resonator implementation. Further, the tuning of a VC-CRO is sufficiently fast to be used within a variety of applications, unlike the tuning of a YIG stabilized oscillator. A key advantage, as a result of the other advantages, is the high performance quality with a low cost. The disadvantage is, as discussed previously, the physical limitation to the size of a ceramic resonator that further causes a limitation to the achievable oscillation frequency.

Another significant limitation to the overall design of a CRO concerns the components used within the PLL-FS, as will be described herein below. Although the block diagrams of FIGS. 1 and 2 accurately depict typical block diagrams for PLL-FS designs, in reality, PLL-FS designs normally have the first frequency divider 22, the phase detector 24 and at least a portion of the second frequency divider 36 combined within a single component, hereinafter referred to as a PLL synthesizer chip. FIG. 3 illustrates a modified block diagram of FIG. 1 for the case that a PLL synthesizer chip 45 incorporates the first frequency divider 22, the phase detector 24 and an internal frequency divider 46. In this case, the second frequency divider 36 is the combination of the internal frequency divider 46 and an external frequency divider 47 coupled between the coupler 30 and the internal frequency divider 46. The main input/outputs for this synthesizer PLL chip 45 include a reference input from the crystal oscillator 20, a feedback input from the external frequency divider 47 and an output to the filter loop 26.

One significant problem for the overall PLL-FS design of FIG. 3 results from the frequency operating parameters with relation to the feedback input of the PLL synthesizer chip 45, this operating parameter setting a maximum frequency level for the feedback input. Currently, this maximum frequency level is limited to approximately 2.8 GHz. In the next couple of years, this value is expected to increase to such values as 4.0 or 6.0 GHz due to advancements in technology. Unfortunately, in traditional designs, this limitation restricts the output frequency of the CRO 28 unless a frequency divider, like the external frequency divider 47, is implemented between the CRO 28 and the PLL synthesizer chip 45. The difficulties with using external frequency dividers include the resulting increases in phase noise, cost and physical size for the overall PLL-FS. This increased phase noise is particularly troubling due to the external frequency divider being implemented within the feedback path, where the PLL-FS is particularly sensitive of phase noise.

Hence, an alternative implementation for a VCO is required that can satisfy high oscillation frequency requirements while maintaining the advantages gained with the use of ceramic coaxial resonators. Preferably, such a design would further compensate for the limitations within the PLL synthesizer chips so that external frequency dividers would not be necessary.

SUMMARY OF THE INVENTION

The present invention is a new configuration for an oscillator design that utilizes a plurality of coaxial resonators within a ring configuration. Typically, a CRO would utilize a single coaxial resonator with a connector at one end coupled to a negative resistance cell. Instead, the present invention uses a set of coaxial resonators with electrical connectors attached on both ends, each end of a resonator being coupled to the end of another one of the resonators within the oscillator to form a ring. In operation, the configuration of the resonators, in combination with amplifiers in parallel with each, preferably results in the overall oscillator producing a plurality of phase shifted signals that if combined can generate a higher frequency signal than is normally generated using a single coaxial resonator of similar size. At the same time, one of the individual phase shifted signals can be fed back within the PLL-FS design, reducing the need for frequency dividers that are necessary in the case that the higher frequency signal is fed back. Overall, the range of use for the advantageous ceramic coaxial resonators can be expanded with the use of this invention.

The present invention, according to a first broad aspect, is an oscillation circuit that consists of a number of coaxial resonators with at least one amplifying apparatus coupled in parallel with one of these coaxial resonators. In this aspect, each of the coaxial resonators have first and second electrical connectors coupled at respective first and second opposite ends, the total number of resonators is greater than two, and the at least one amplifier has a phase shift from input to output. Further, for the first broad aspect, the combined gain of the at least one amplifying apparatus is greater than a loss for the oscillation circuit and the coaxial resonators are coupled in series within a ring such that the total electrical length of the coaxial resonators in the ring equals 360°.

Preferably, within the oscillator circuit of the first broad aspect, there is an amplifying apparatus in parallel with each of the coaxial resonators. In preferred embodiments, the amplifying apparatus consists of an amplifier and a phase shifter that is controlled by a tuning voltage. Further within preferred embodiments, the oscillation circuit has a node between each adjacent coaxial resonators sampled with the samples being combined at a node further coupled to a tuned circuit. In this manner, oscillation circuits of preferred embodiments can generate oscillation signals that are higher than would be possible using traditional circuits with a coaxial resonator of similar size.

According to another broad aspect, the present invention is a Phase Locked Loop-Frequency Synthesizer (PLL-FS) that includes the oscillation circuit of the first broad aspect. Preferably, this synthesizer further comprises a crystal resonator, a Phase Locked Loop (PLL) synthesizer component, an amplifier, and an active or passive loop filter. Preferably, no frequency divider beyond what is included within the PLL synthesizer component is required.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

The preferred embodiment of the present invention is described with reference to the following figures, in which:

FIGS. 6A and 6B are detailed diagrams illustrating respective cross-sectional and longitudinal views of a ceramic coaxial resonator;

FIGS. 6C and 6D are detailed diagrams illustrating longitudinal views of the ceramic resonator of FIGS. 6A and 6B with respectively a well-known single connector configuration and a double connector configuration according to a preferred embodiment of the present invention;

FIG. 12 is a schematic diagram illustrating a phase shifter implemented within the ring oscillator of FIG. 11A;

FIGS. 13A, 13B, 13C and 13D are graphical illustrations of possible voltage waveforms generated at nodes A through D respectively within FIG. 11A;

FIG. 15A is a graphical illustration of a possible voltage waveform combining the waveforms depicted in FIGS. 14A through 14D, that preferably drives the tuned circuit of FIG. 11B; and FIG. 15B is a graphical illustration of a voltage waveform combining the waveforms depicted in FIGS. 13A through 13D, that alternatively drives the tuned circuit of FIG. 11B if no step recovery diodes are used.

DETAILED DESCRIPTION OF THE PREFERRED EMBODIMENTS

Preferred embodiments of the present invention are directed to oscillator designs that allow for high oscillation frequencies while continuing to utilize ceramic coaxial resonators to stabilize the oscillators; hence, maintaining the benefits associated with these resonators. These oscillator designs preferably are such that when replacing the well-known VC-CRO 28 within FIG. 1, the PLL-FS of FIG. 1 can be used for high frequency applications such as LMDS applications. In exemplary embodiments, the use of the oscillator designs does not require frequency dividers to lower the frequency being input to the PLL synthesizer chip.

The oscillator designs, illustrated in FIGS. 5A, 5B, 7 and 9, compensate for the minimum size requirement associated with ceramic coaxial resonators by using a single resonator with an electrical connector on either end to stabilize two apparatuses that appear in operation to have negative resistances, hereinafter referred to as negative resistance cells. Essentially, as will be described herein below in detail, this effectively results in a dividing of the ceramic coaxial resonator into two resonators while in operation. Hence, the resonator operates as two resonators half the size of the single resonator, resulting in a doubling of the frequency of resonance when compared to the typical frequency generated with the single ceramic coaxial resonator.

In preferred embodiments, as are described with reference to FIGS. 11A through 15B, similar coaxial resonators with electrical connectors on either end are utilized. In these preferred embodiments, rather than have a single resonator having ends coupled to respective negative resistance cells, a plurality of resonators are coupled into a ring configuration, preferably a ring configuration of four resonators within a circle. Preferably, in parallel with each resonator, is an amplifier that is tuned to cause oscillations as will be described herein below.

To aid in the explanation concerning the operation of the oscillators according to preferred embodiments, the operation of a typical oscillator with a single negative resistance cell and a single coaxial resonator will first be described in detail with reference to FIG. 4. In this case, the negative resistance cell is in a Colpitts design. Subsequently, descriptions of oscillators that have more than one oscillator use a single resonator will be described with reference to FIGS. 5A, 5B, 7, 9 and the preferred embodiment of FIGS. 11A and 11B.

Figure 4:
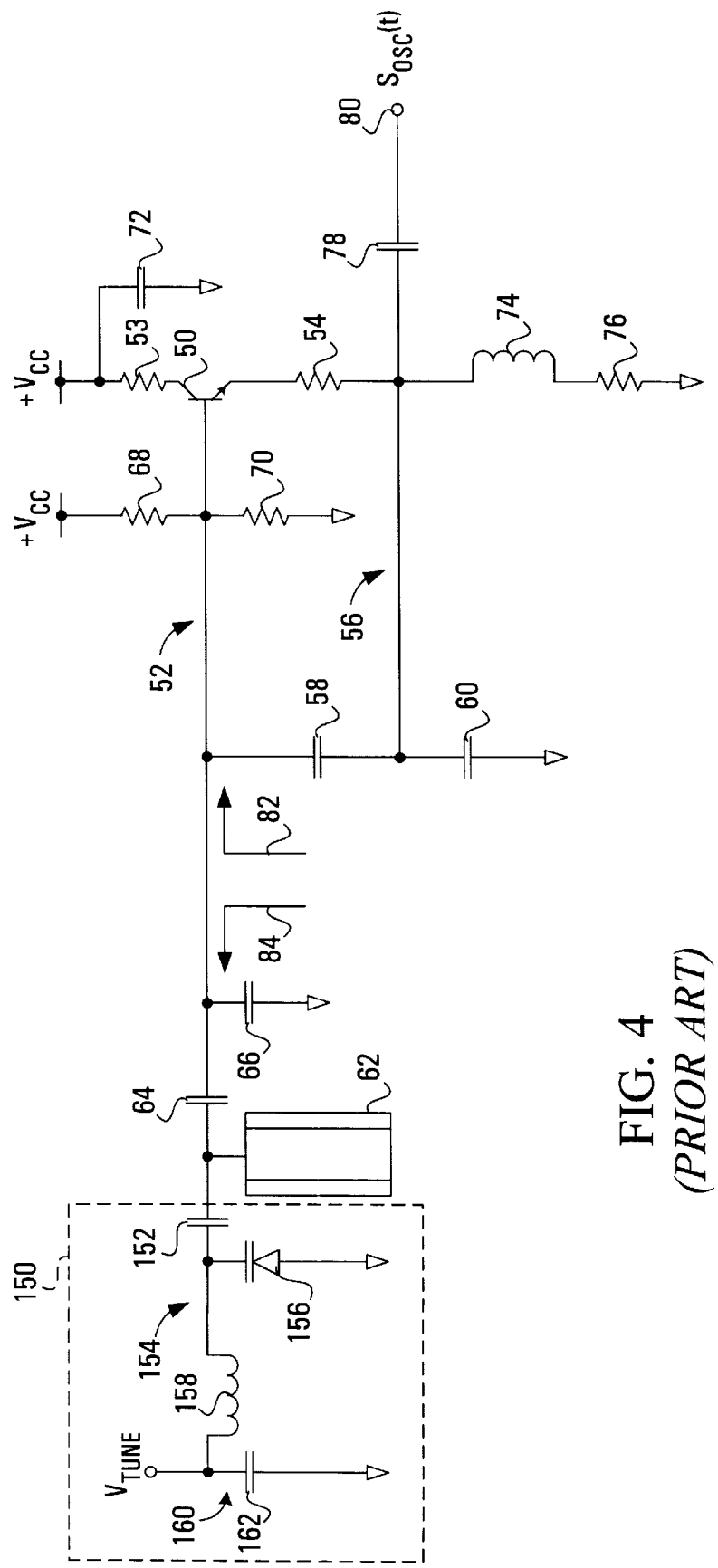
FIG. 4 is a detailed schematic diagram illustrating a well-known Colpitts oscillator using a ceramic coaxial resonator.

FIG. 4 illustrates a schematic diagram of a VC-CRO comprising a negative resistance cell of the Colpitts type that is stabilized with use of a ceramic coaxial resonator. As can be seen within FIG. 4, the VC-CRO comprises a transistor 50 having a collector coupled to a power rail ($V_{CC}$) via an impedance controlling resistor 53, a base coupled to a node 52, and an emitter coupled to a node 56 via a noise suppression resistor 54. The impedance controlling resistor 53 maintains a controlled impedance on the collector of the transistor 50. The noise suppression resistor 54 increases the linearity of the transconductance corresponding to the transistor 50 by reducing the up conversion of baseband flicker noise present in the transistor 50, but also reduces the transistor's gain. Also coupled to the node 56 is a first feedback capacitor 58 coupled between the nodes 52 and 56 and a second feedback capacitor 60 coupled between the node 56 and ground, which together operate to produce a capacitor divider that determines the loop gain for the oscillator. It should be recognized that the transistor 50 and capacitors 58,60 in operation comprise the basic components required within a negative resistance cell of the Colpitts type.

Further included within the negative resistance cell of FIG. 4 is a first biasing resistor 68 coupled between the node 52 and the power rail, a second biasing resistor 70 coupled between the node 52 and ground, a capacitor 72 coupled from the power rail side of resistor 53 to ground, a choke inductor 74 coupled to the node 56, a resistor 76 coupled between the choke inductor 74 and ground, and a coupling capacitor 78 coupled between the node 56 and an output terminal 80 for the circuit. The first and second biasing resistors 68,70 are used to maintain a biasing voltage at the base of the transistor 50. The capacitor 72 operates to ensure the power rail ($V_{CC}$) appears as a short circuit in terms of the RF spectrum. The resistor 76 sets the dc bias level while the choke inductor 74 essentially removes the resistor 76 from the circuit in terms of the RF spectrum. Overall, it should be recognized that the devices 68,70,53,54,72,74,76 aid in the proper operation of the transistor 50 and capacitors 58,60.

Also coupled to the node 52 is a ceramic coaxial resonator 62 and a frequency adjustment apparatus 150, via a coupling capacitor 64, and a phase noise optimization capacitor 66 coupled between the node 52 and ground. The coupling capacitor 64 operates to align the impedance locus of the resonator 62 at resonance with that of the impedance in the remainder of the oscillator. The frequency adjustment apparatus, as described herein below, controls the tuning of the oscillation frequency for the overall circuit.

There are two conditions that must be met for the circuit depicted in FIG. 4 to oscillate. Firstly, the overall loop gain of the feedback path for the transistor 50, comprising capacitors 58,60, resistor 54, the losses corresponding to the resonator 62, and the load on output node 80 must be greater than unity. Secondly, a first reactance looking from arrow 82 must be the complex conjugate of a second reactance looking from arrow 84. This constraint indicates that the reactance resulting from the ceramic coaxial resonator 62 and capacitors 64,66 must be the complex conjugate of the reactance resulting from the transistor 50 and capacitors 58,60 (the negative resistance cell). Since the reactance of these devices changes with frequency, the oscillation frequency will occur when the frequency versus reactance characteristics of the first and second reactance are equal and opposite. Since the reactance of the transistor 50 fluctuates as a function of the transistor noise, the slope of the source frequency versus reactance characteristic for the resonator 62 (this slope representing the Q value for the resonator) should be high in order to reduce the effect the fluctuations of reactance within the transistor 50 have on the oscillation frequency for the overall circuit.

As mentioned previously, the VC-CRO of FIG. 4 includes the frequency adjustment apparatus 150 that is used to adjust the oscillation frequency for the circuit. In the case shown in FIG. 4, the frequency adjustment apparatus 150 comprises a coupling capacitor 152 coupled between the electrical connector of the resonator 62 and a node 154, a varactor diode 156 with its cathode coupled to the node 154 and its anode coupled to ground, a choke inductor 158 coupled between the node 154 and a node 160, and a capacitor 162 coupled between the node 160 and ground. In this set-up, if a positive tuning voltage ($V_{TUNE}$) is applied to the node 160, the diode 156 becomes reverse biased. This reverse biasing results in an increase in the depletion region of the device which in turn results in a decrease in the capacitance of the diode 156. Since the varactor diode is coupled to the resonator 62 via the coupling capacitor 152, the adjustment in the capacitance of the diode allows for the regulating of the load on the resonator 62. Overall, by changing the tuning voltage ($V_{TUNE}$), it is possible to adjust the load impedance on the resonator 62 which directly changes the frequency of oscillation.

It is noted that without the frequency adjustment apparatus 150, the VC-CRO of FIG. 4 would not be voltage controlled. It also should be understood that other VC-CRO implementations may use other varactor diode configurations or completely different techniques to adjust the oscillation frequency of the VC-CRO.

As discussed herein above, the oscillation frequency corresponding to the VC-CRO of FIG. 4 is limited to less than or equal to 5 GHz due to physical constraints on the ceramic coaxial resonator 62.

Figure 5A:
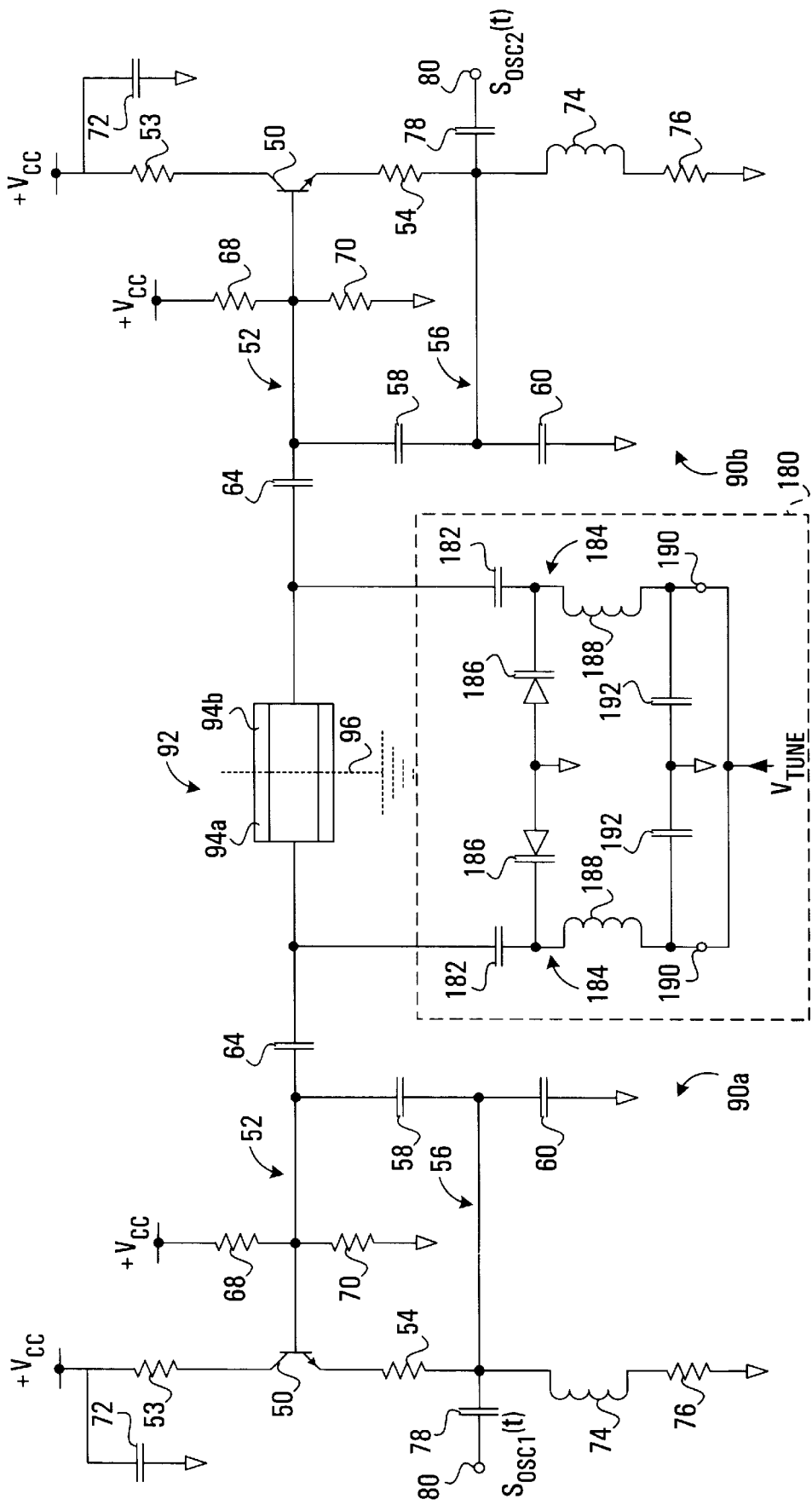
FIG. 5A is a schematic diagram illustrating a balanced oscillator utilizing a single resonator.

FIG. 5A illustrates a schematic diagram of an oscillator design that utilizes a single resonator for two balanced oscillators. In this implementation, the oscillator design comprises first and second negative resistance cells 90a,90b, in this case each being of the Colpitts oscillator type, that are coupled to electrical connectors at opposite ends of a single coaxial resonator 92, in this case a ceramic coaxial resonator. These first and second negative resistance cells 90a,90b combined with the resonator 92 create first and second oscillators respectively that output first and second oscillation signals $S_{OSC1}(t), S_{OSC2}(t)$.

Each of these negative resistance cells 90a,90b in FIG. 5A is identical to the negative resistance cell depicted in FIG. 4. Effectively, the components within these negative resistance cells operate in similar fashion to those previously described for the well-known negative resistance cell of FIG. 4.

In FIG. 5A, the first and second negative resistance cells 90a,90b of FIG. 5A are balanced so that they operate in anti-phase, i.e. operating at the same frequency but approximately 180° out-of-phase. This means that the current traversing node 52 within the first negative resistance cell 90a will be increasing when the current traversing node 52 within the second negative resistance cell 90b is decreasing, and vice versa. This anti-phase operation within the two negative resistance cells results in the ceramic coaxial resonator 92 operating in a differential mode. This differential mode operation effectively divides the resonator 92 into first and second halves 94a,94b by the creation of a virtual ground 96 in the center of the resonator 92.

The division of the ceramic coaxial resonator 92 into two halves 94a,94b during operation reduces the effective length by half of the resonator that is stabilizing each negative resistance cell 90a,90b. Since the physical size of a ceramic coaxial resonator is inversely proportional to the frequency of resonance, the end result is a doubling of the oscillation frequency within the first and second oscillators. Hence, the resulting oscillation signals $S_{OSC1}(t), S_{OSC2}(t)$ at the output terminals 80 of the first and second oscillators respectively have an oscillation frequency approximately twice the frequency of resonance normally achieved with the resonator 92 if implemented within the VC-CRO of FIG. 4.

One modification between the CRO of FIG. 4 and the particular implementation of the first and second oscillators depicted within FIG. 5A is the removal of capacitor 66. When the oscillation frequency is doubled using the present invention, the loss due to the capacitor 66 will increase. Although this capacitor 66 can increase the Q value for the resonator 92 if coupled between the node 52 and ground, it is not included in the design depicted in FIG. 5A due to the reduction in loop gain that the capacitor creates at high frequencies. Alternatively, a capacitor is included between the node 52 and ground within both the first and second oscillators. The losses due to the capacitors could be deemed acceptable in these alternative implementations due to the particular design parameters, the characteristics of the devices used, and/or due to the oscillators being operated at lower frequencies.

It is noted that similar to FIG. 4, the first and second oscillators within FIG. 5A are voltage controlled oscillators. As depicted in FIG. 5A, a frequency adjustment apparatus 180 is coupled to both electrical conductors of the resonator 92. This frequency adjustment apparatus 180 preferably consists of two of the frequency adjustment apparatuses 150 depicted within FIG. 4 with a common tuning voltage ($V_{TUNE}$). As depicted in FIG. 5A, the frequency adjustment apparatus 180 comprises, for both halves 94a,94b of the resonator 92, a coupling capacitor 182 coupled between one of the electrical connectors of the resonator 92 and a node 184; a varactor diode 186 with its cathode coupled to the node 184 and its anode coupled to ground; a choke inductor 188 coupled between the node 184 and a node 190; and a decoupling capacitor 192 coupled between the node 190 and ground. The coupling capacitors 182 operate to reduce any losses at the varactor diodes 186 from loading the resonator 92 while the decoupling capacitors 192 operate to decouple the tuning voltage ($V_{TUNE}$) at low frequencies in order to suppress noise on the tuning signal. In this implementation, similar to that described above for the apparatus 150, a positive tuning voltage ($V_{TUNE}$) will result in both diodes being reverse biased. This in turn will result in an increase in their corresponding depletion regions and a decrease in their capacitance. Hence, the tuning voltage $V_{TUNE}$ can regulate the loading of both sides of the resonator 92 and ultimately control the oscillation frequencies corresponding to the first and second oscillators. In this implementation, the oscillation frequencies for the first and second oscillators track each other since there is a common tuning voltage. In alternative implementations, other well-known techniques to adjust the frequency of an oscillator with an applied voltage could be utilized within FIG. 5A in place of the frequency adjustment apparatus 180.

Although the output terminals are coupled to the nodes 56, which are low impedance nodes, within the oscillator design depicted within FIG. 5A, it should be recognized that there are other possible output terminal locations. For instance, the outputs of the first and second oscillators could be at the collectors of the transistors 50. Further, the output stage for these oscillators could comprise a cascode implementation as is illustrated within FIG. 5B with cascode apparatuses 220a,220b coupled to the collectors of the transistors 50 within the first and second oscillators respectively. These cascode apparatuses, in this case, each comprise a transistor 222 with a collector coupled to a node 224, a base coupled to a node 226, and an emitter coupled to the collector of the corresponding transistor 50. Within FIG. 5B, the node 224 is further coupled to an output terminal 228 via a coupling capacitor 230 and a choke inductor 232 that is coupled between the node 224 and a node coupled to the power rail and a grounded capacitor 234. The node 226 is further coupled to a first biasing resistor 236 coupled between the power rail and the node 226, a second biasing resistor 238 coupled between the node 226 and ground, and a grounded capacitor 240. Cascode apparatuses, such as the apparatuses 220a,220b within FIG. 5B, are used to provide a low impedance at the collector of their respective transistors 50 as well as boost the signal voltage power of their respective output oscillation signals $S_{OSC1}(t), S_{OSC2}(t)$, in some cases replacing the need for a further amplifying stage.

Figure 1:
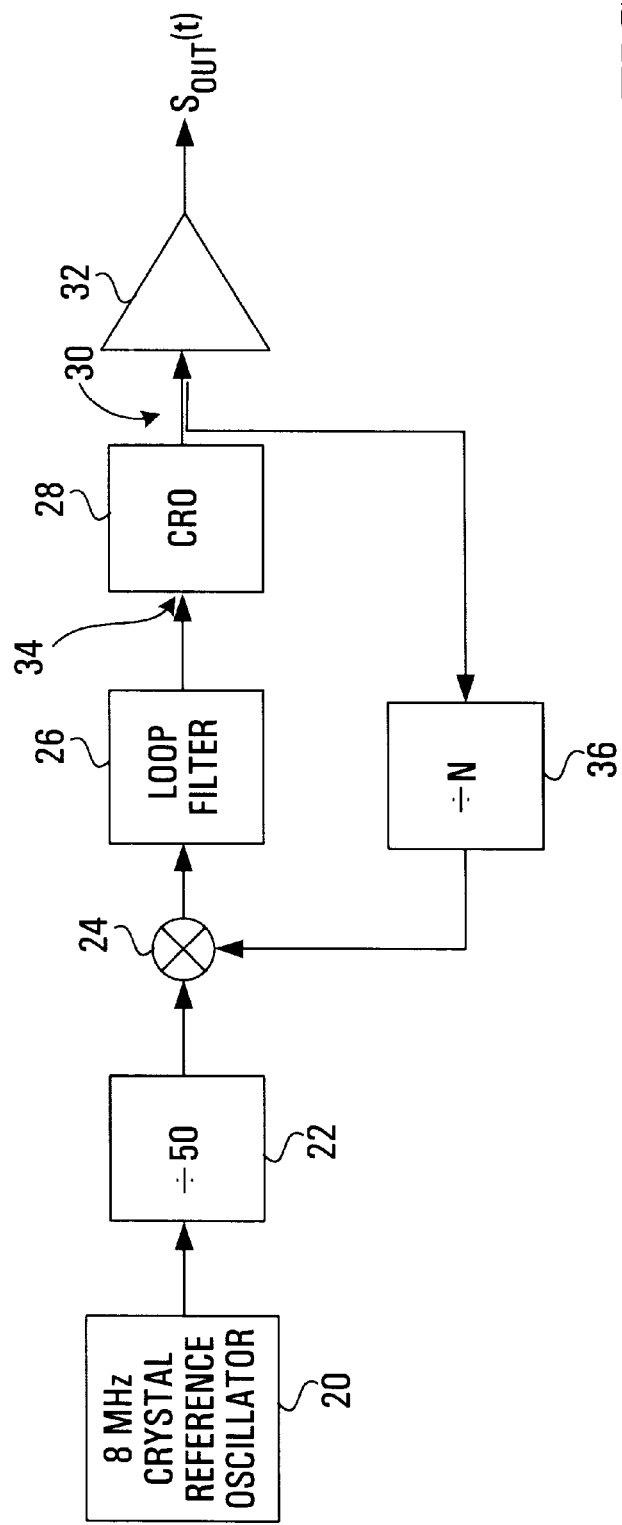
FIG. 1 is a block diagram illustrating a well-known Phase Locked Loop-Frequency Synthesizer (PLL-FS) configuration.
Figure 5B:
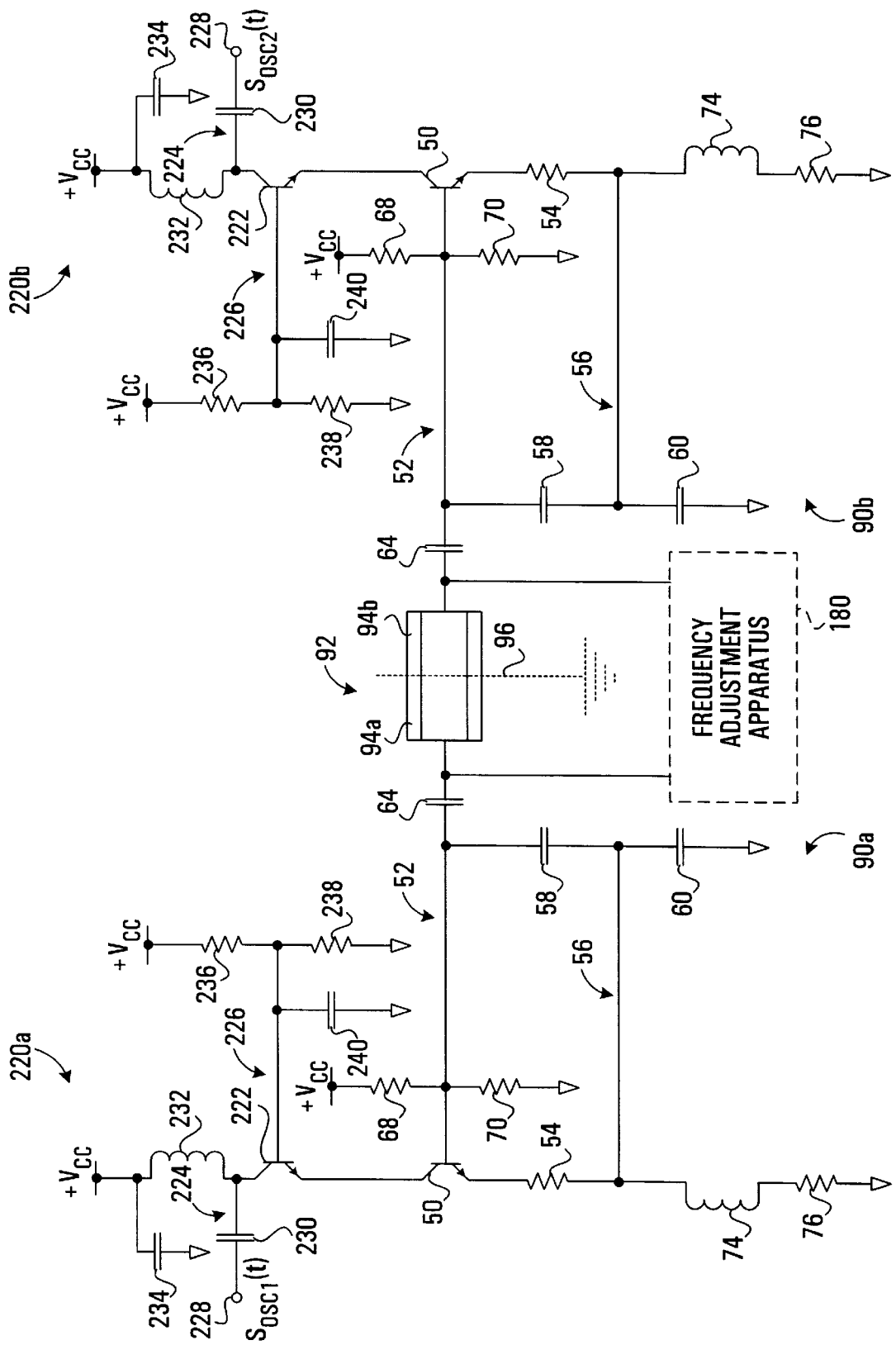
FIG. 5B is the schematic diagram of FIG. 5A with an additional cascode transistor configuration.

It should be understood that the oscillator design depicted in FIG. 5A or 5B could replace the standard VC-CRO depicted in FIG. 4 within the PLL-FS of FIG. 1. This change effectively doubles the oscillation frequency of the PLL-FS without the need for doublers and/or filters. At most the amplifier 32 depicted in FIG. 1 and/or a cascode stage as depicted in FIG. 5B is required to increase the output power level after the VC-CRO of FIG. 5A.

FIGS. 6A and 6B illustrate cross-sectional and longitudinal views 108,110 respectively of a typical ceramic coaxial resonator with no electrical connectors attached. The resonator depicted in FIGS. 6A and 6B is a rectangular prism of ceramic dielectric material with a hole 112, in this case a circular hole, running longitudinally through it. This resonator includes first and second ends 114,116 in which the openings of the hole 112 are located, as well as four other outside longitudinal surfaces. FIG. 6C illustrates a longitudinal view of the resonator of FIG. 6A with a first electrical connector 118 attached to the inside surface of the hole 112 at the first end 114. This resonator is typical for the implementation of the resonator 62 within FIG. 4. For this implementation, the longitudinal outside surfaces, the inside surfaces of the hole 112, and possibly the second end 116 would have a layer of conductive material added, normally the conductive material being a metal such as copper or silver. The first electrical connector 118 could preferably be attached to the ceramic dielectric material via the conductive material layer on the inside surface of the hole 112 near the first end 114.

A modification, according to preferred embodiments of the present invention as depicted in FIG. 6D, that is made to a standard ceramic coaxial resonator, such as the resonator 62 within FIG. 4, is the addition of a second electrical connector 120 at the second end surface 116. The first and second electrical connectors 118,120 are necessary to connect the resonator 92 to the capacitors 64 within the respective first and second oscillators of FIGS. 5A and 5B. This second electrical connector 120 is preferably connected to the ceramic dielectric material in a similar manner as the first electrical connector 118 but via the conductive material layer on the inside surface of the hole 112 near the second end 116. Alternatively, another technique is used to attach the first and/or second electrical connectors such as soldering. It is noted that electrical connectors could be conductive tabs or further another component that makes it possible for the resonator 92 to be part of an oscillator on either end 114,116.

Although the ceramic coaxial resonator depicted within FIGS. 6A through 6D is in the shape of a rectangular prism and the hole 112 is depicted as circular, these characteristics are not meant to limit the scope of the present invention. The resonator can be of a different shape that still properly resonates as long as the opposite ends of the resonator are capable of being coupled to negative resistance cells. For instance, the resonator could be a cylindrical prism and/or have no hole but simply a conductive link between the opposite ends of the resonator. Yet further, the use of ceramic dielectric material within the coaxial resonator is not meant to limit the scope of the present invention. Another dielectric material could replace the ceramic material, though currently ceramic material is preferred due to the better performance characteristics.

Figure 7:
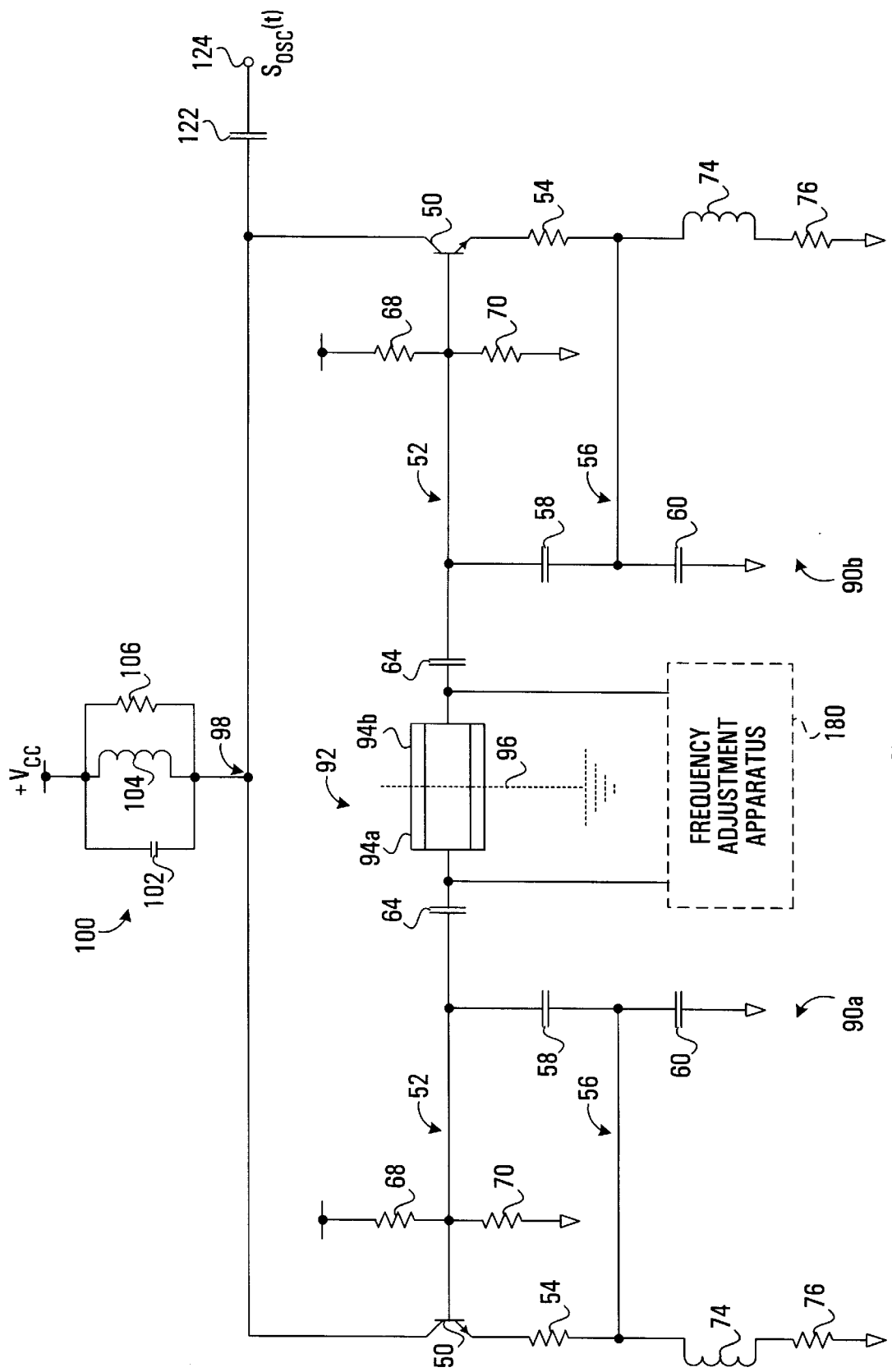
FIG. 7 is a schematic diagram illustrating a push-push oscillator.

Another oscillator design that utilizes the ceramic coaxial resonator of FIG. 6D is depicted within FIG. 7. This design comprises two balanced negative resistance cells 90a,90b, similar to those described herein above with reference to FIG. 5A, these cells operating with the resonator 92 as first and second oscillators that are out-of-phase by approximately 180°. The key difference between the implementations of FIGS. 5A and 7 is the outputting of the oscillation signals from the overall oscillator. As can be seen in FIG. 7, the resistors 53, capacitors 72, coupling capacitors 78, and outputting terminals 80 have been removed within the balanced negative resistance cells 90a,90b. In place of these devices, the collectors corresponding to the transistors 50 within FIG. 7 have been coupled together at a node 98 and further coupled to a tuned circuit 100 and an output terminal 124 via a coupling capacitor 122.

The tuned circuit 100 preferably comprises a capacitor 102, an inductor 104, and a resistor 106 coupled in parallel between the power rail and the node 98. This tuned circuit 100 is tuned to the second harmonic frequency of the oscillators, that being twice the oscillation frequency corresponding to the first and second oscillators in order to suppress the fundamental frequency and select out the second harmonic. Although, in FIG. 7, the tuned circuit 100 comprises a number of devices in parallel, alternatively, other circuits that have a specific tuned frequency could be utilized such as a single inductor or a quarter wave resonant line.

Figures 8A, 8B, 8C:
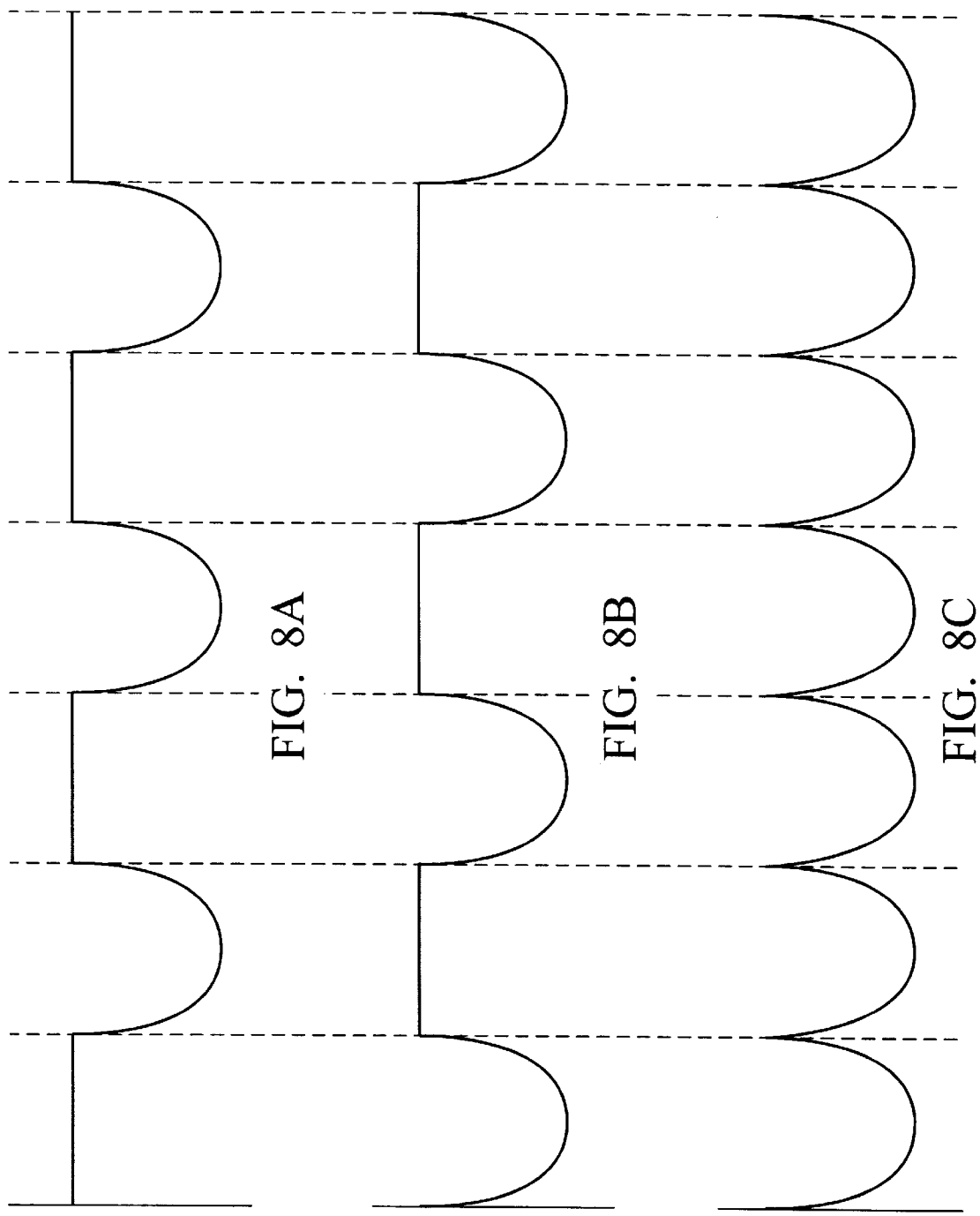
FIGS. 8A and 8B are graphical illustrations of possible voltage waveforms generated by the transistors within the first and second negative resistance cells of FIG. 7.
FIG. 8C is a graphical illustration of a possible voltage waveform combining the waveforms depicted in FIGS. 8A and 8B, that drives the tuned circuit of FIG. 7.

Effectively, the single output at the output terminal 124 of FIG. 7 is a combination of the oscillation signals from the first and second oscillators that are out-of-phase by approximately 180°. FIGS. 8A and 8B illustrate graphical depictions of possible voltage waveforms generated by transistors 50 within the first and second negative resistance cells 90a,90b respectively. Further, FIG. 8C depicts a possible voltage waveform combination of the waveforms depicted in FIGS. 8A and 8B, this combined waveform driving the tuned circuit 100 within FIG. 7. As can be seen in FIGS. 8A and 8B, the waveforms generated by the transistors 50 are clipped sinusoidal signals that are out-of-phase by 180°. The clipping in these signals can be due to the transistors 50 going into compression as the signal voltage is limited by a power rail or due to the transistors 50 being shut off for a period of time as the transistors are limited through cut-off. The result of a combination of the voltage waveforms shown in FIGS. 8A and 8B, as depicted within FIG. 8C, is a voltage waveform with an overall oscillation frequency double that of each of the first and second oscillators. This type of circuit, in which two balanced oscillators generate two anti-phase clipped signals at a first frequency and combine the clipped signals to generate a signal at a second frequency twice the value of the first frequency, is known as a push-push oscillator. As depicted within FIG. 7, the use of the push-push oscillator design can allow for a quadrupling of the resulting oscillation frequency when compared to the frequency of resonance that would be achieved using the resonator 92 within the oscillator of FIG. 4.

Figure 9:
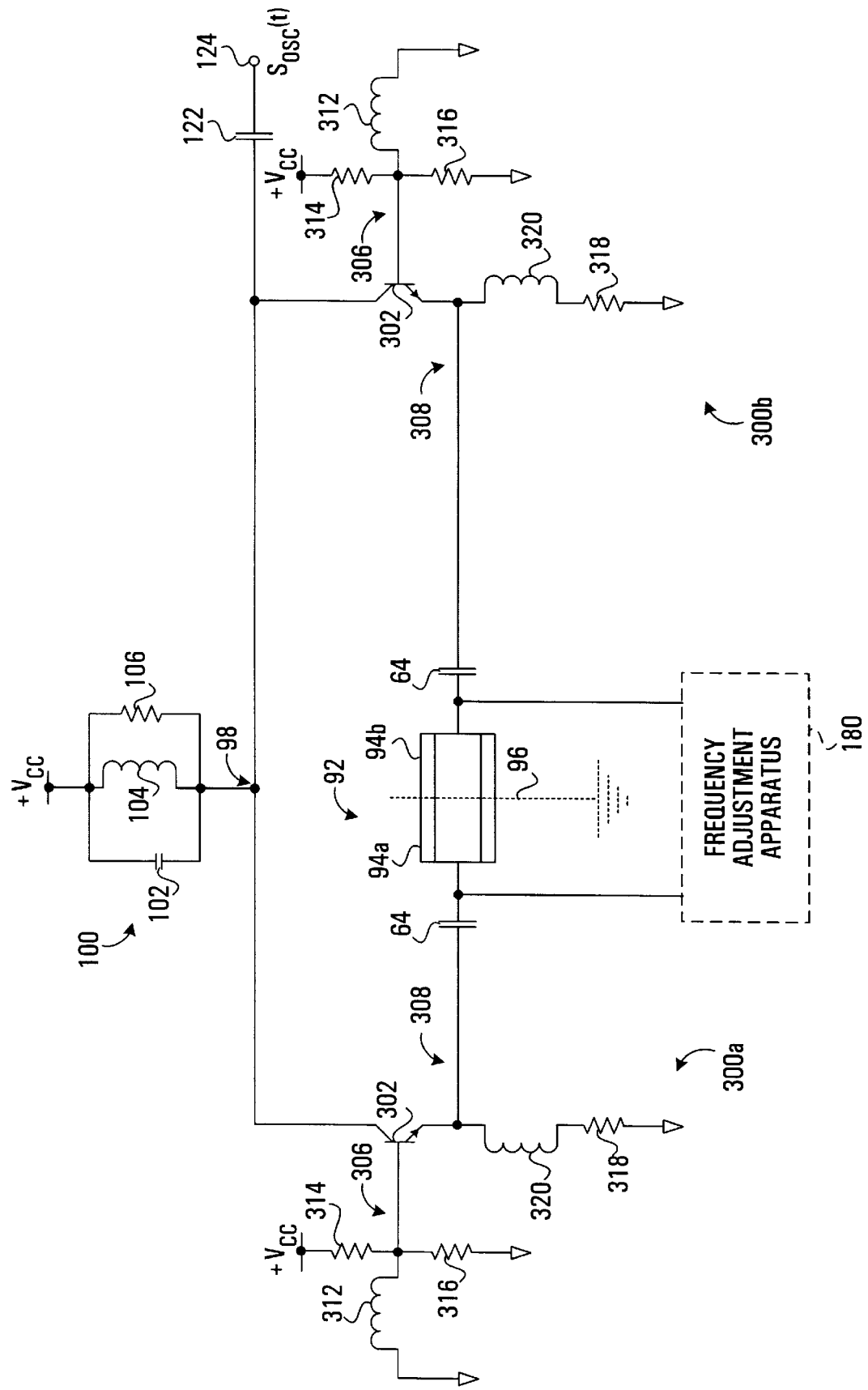
FIG. 9 is a schematic diagram illustrating an alternative push-push oscillator.

Although oscillator implementations described above are with respect to negative resistance cells of a Colpitts type, alternatively other negative resistance cells could be used. There are many well-known apparatuses that function as negative resistance cells in operation that can be coupled to either side of a coaxial resonator to generate an oscillator. For example, FIG. 9 illustrates the push-push architecture of FIG. 7 with the negative resistance cells of the Colpitts type replaced with alternative negative resistance cells 300a, 300b. In this case, each of the negative resistance cells 300a,300b comprise a transistor 302 with a collector coupled to the node 98 (and further coupled to the other collector), a base coupled to a node 306 and an emitter coupled to a node 308. The nodes 308 are each further coupled to a respective end of the resonator 92 via coupling capacitor 64. The nodes 306 are each further coupled to an inductor 312 coupled between the node 306 and ground, a first biasing resistor 314 coupled between the node 306 and the power rail, and a second biasing resistor 316 coupled between the node 306 and ground. The emitter biasing in these negative resistance cells 300a,300b is achieved through respective resistors 318 which are isolated from the RF circuit by respective choke inductors 320 in series. The remaining components depicted in FIG. 9 have previously been described herein above with reference to other implementations. The overall operation of the push-push oscillator depicted in FIG. 9 is similar to the design of FIG. 7 but with a different configuration for the balanced negative resistance cells. The end result is similar, that being a quadrupling of the oscillation frequency at the output terminal 124 compared to the traditional frequency of resonance for the resonator 92 when in a set-up as depicted in FIG. 4.

The VCOs described above with reference to FIGS. 5A, 5B, 7 and 9 generate higher frequency signals than typical VCOs using ceramic coaxial resonators of similar dimensions. These higher frequency signals can reduce the need for frequency multiplication stages after the VCO while still allowing the use of ceramic coaxial resonators. Unfortunately, one key problem that remains, and in fact increases in importance, concerns the need for frequency dividers to reduce the frequency of the feedback signal to a level that can be input to a frequency limited PLL synthesizer chip.

Figure 3:
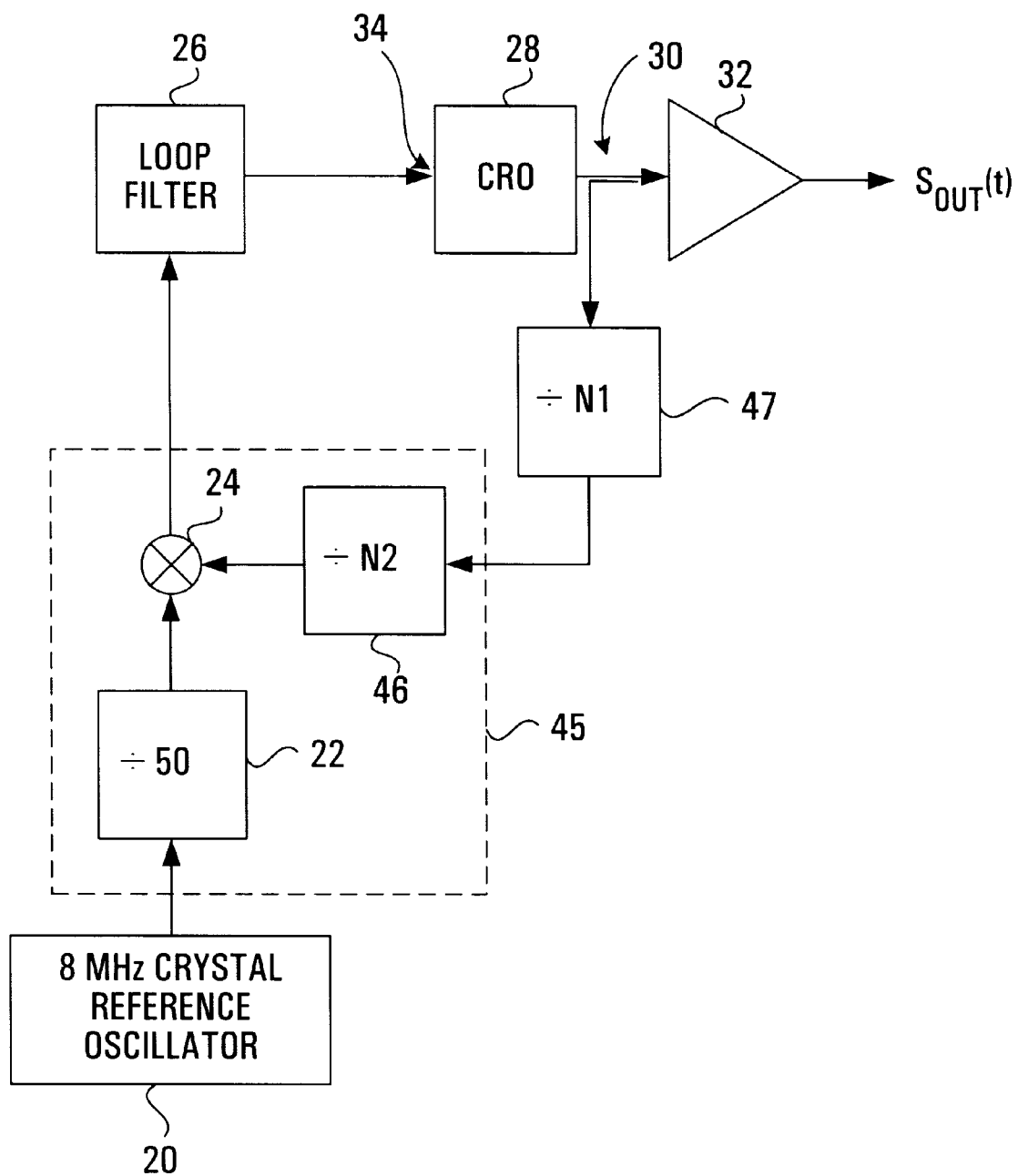
FIG. 3 is a block diagram illustrating the PLL-FS configuration of FIG. 1 but with the composition of a PLL synthesizer chip depicted.
Figure 10:
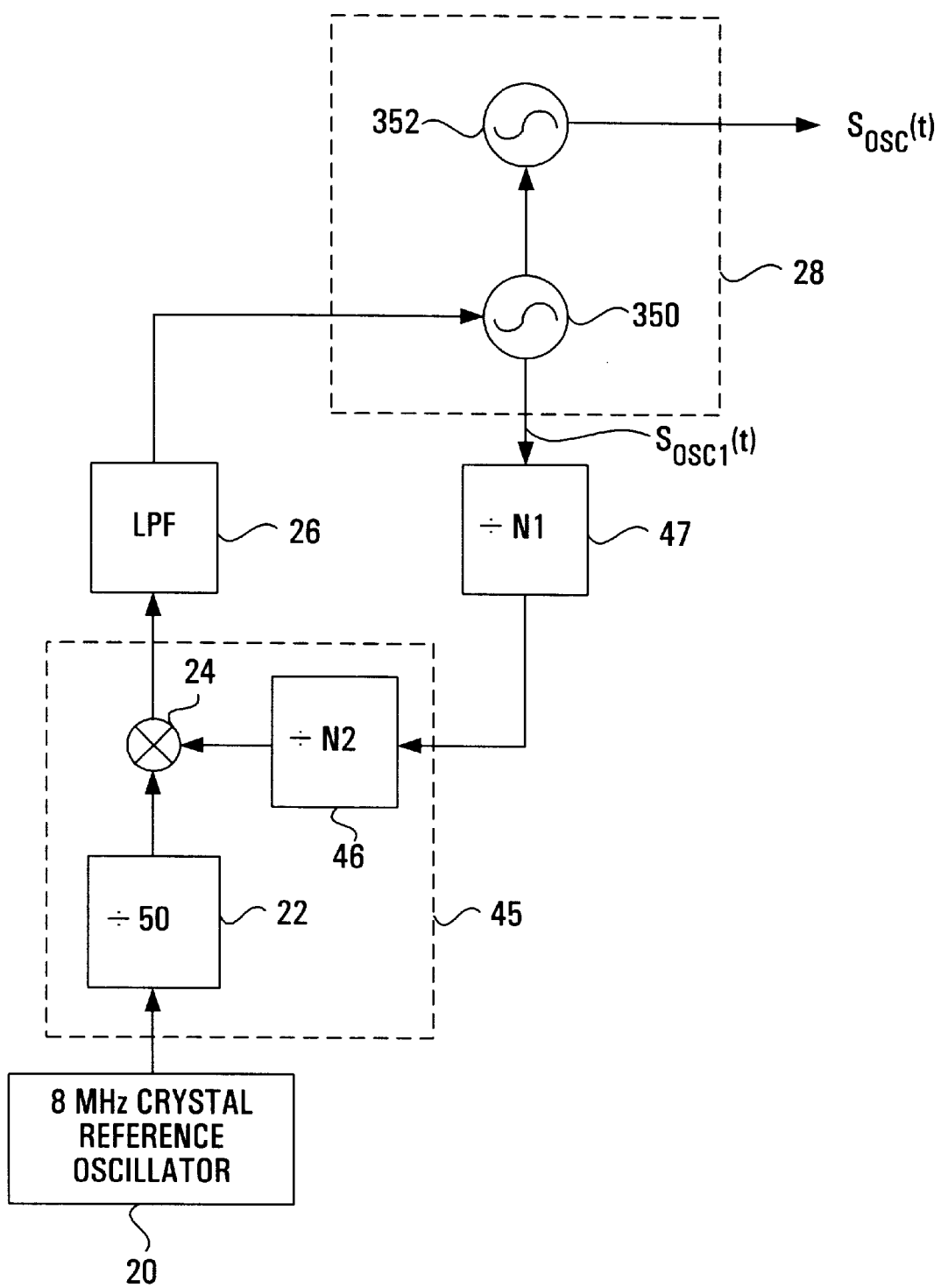
FIG. 10 is a block diagram illustrating the push-push oscillator of FIG. 7 being implemented within a PLL-FS configuration, with the PLL synthesizer chip depicted.

This problem can be somewhat mitigated with the sampling of the first or second oscillation signals $S_{OSC1}(t), S_{OSC2}(t)$ of FIG. 5A within a push-push oscillation design of FIG. 7. FIG. 10 is a block diagram illustrating the PLL-FS of FIG. 3 in the case that the VC-CRO 28 is a push-push oscillator that samples one of the individual oscillation signals $S_{OSC1}(t), S_{OS2}(t)$ (similar to that depicted in FIGS. 5A) as well as the overall oscillation signal $S_{OSC}(t)$. As shown in FIG. 10, the VC-CRO 28 logically comprises a first oscillator 350 that generates a signal $S_{OSC1}(t)$ at a first frequency and a second oscillator 352 that generates a signal $S_{OSC}(t)$ at a second frequency that is twice that of the first frequency. Hence, the level of frequency division required within the external frequency divider 47 in this situation is reduced by two compared to the case that the full frequency signal $S_{OSC}(t)$ was used for feedback purposes. This reduction in the frequency division can result in simpler external dividers which in turn can reduce the phase noise, cost and physical size resulting from such devices. In some particular cases, the use of the above described technique for the push-push oscillator design can result in the removal of the need for the external frequency divider 47 altogether, depending upon the design characteristics required and the operating parameters of the PLL synthesizer chip 45.

Another oscillator design according to preferred embodiments of the present invention is now described with reference to FIGS. 11A and 11B. In this preferred embodiment of the present invention, the oscillator design has a first output signal sampled with a frequency range similar to that of the push-push oscillator design of FIG. 7 as well as a second output signal sampled with a frequency one quarter that of the first output signal. The sampling of this second output signal can reduce the need for an external frequency divider, as will be described herein below, even when compared to the push-push oscillator design described above.

Figure 11A:
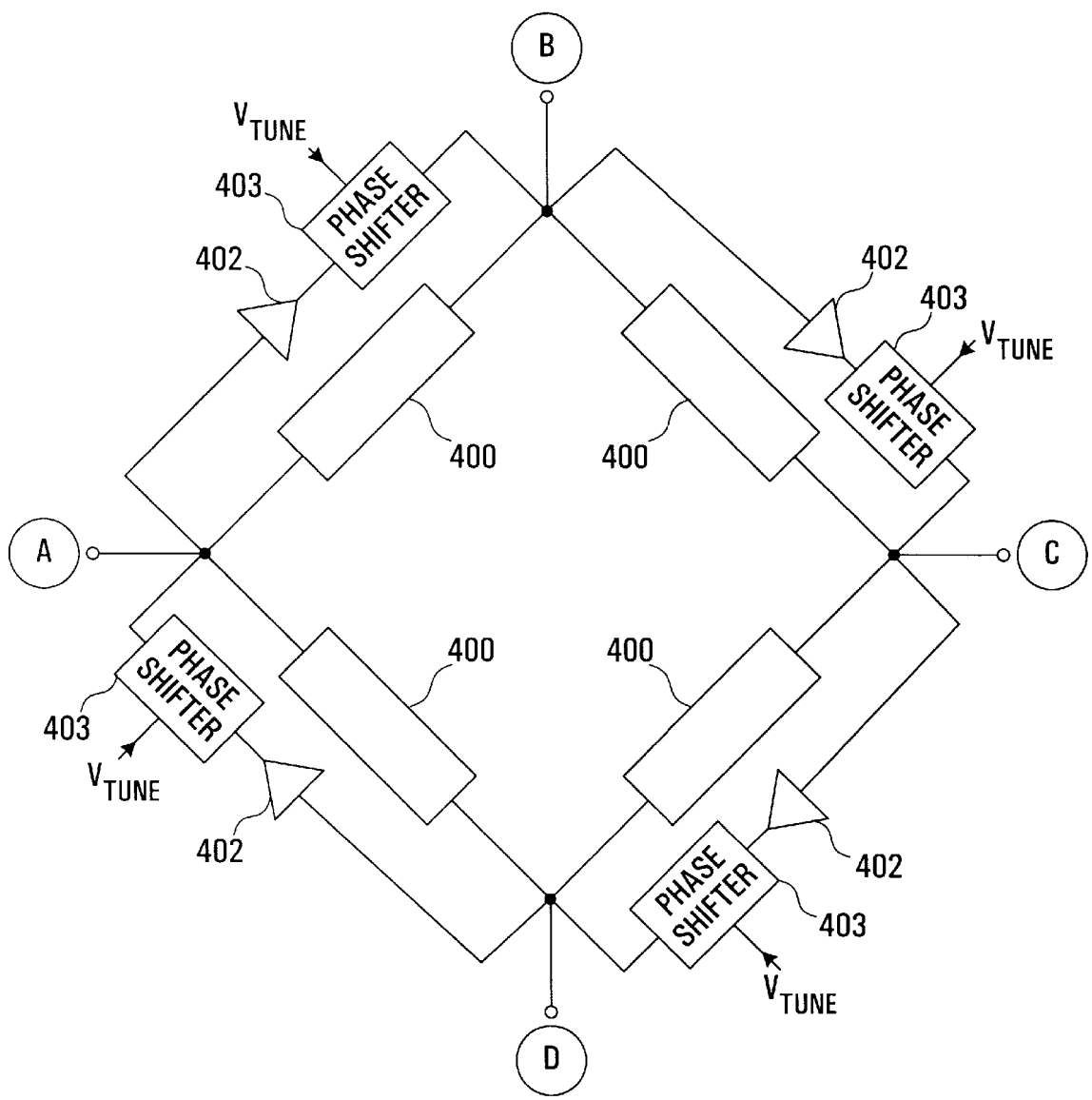
FIGS. 11A and 11B together form a schematic diagram illustrating a ring oscillator according to a preferred embodiment of the present invention.
Figure 11B:
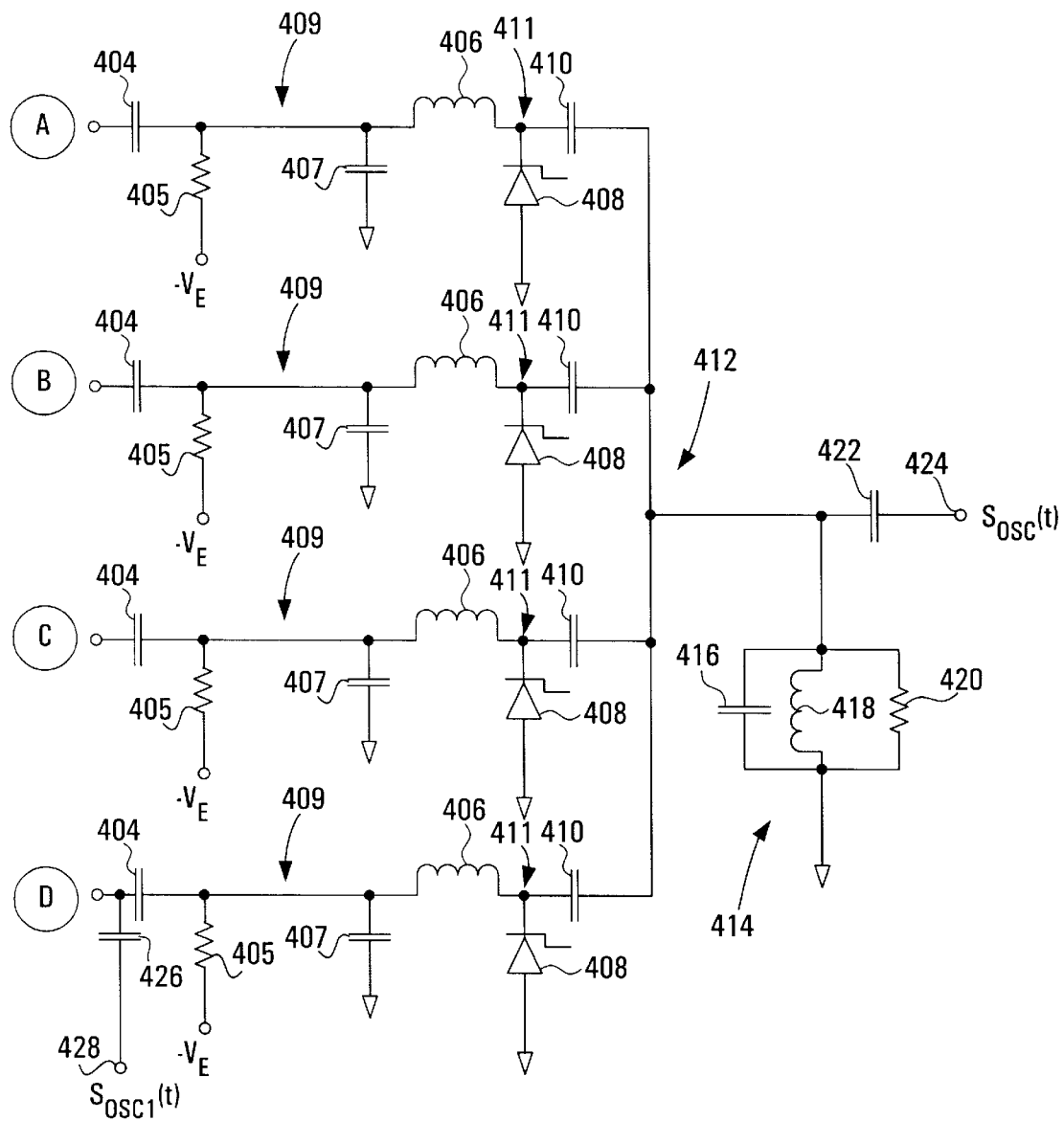
Figures 14A, 14B, 14C, 14D:
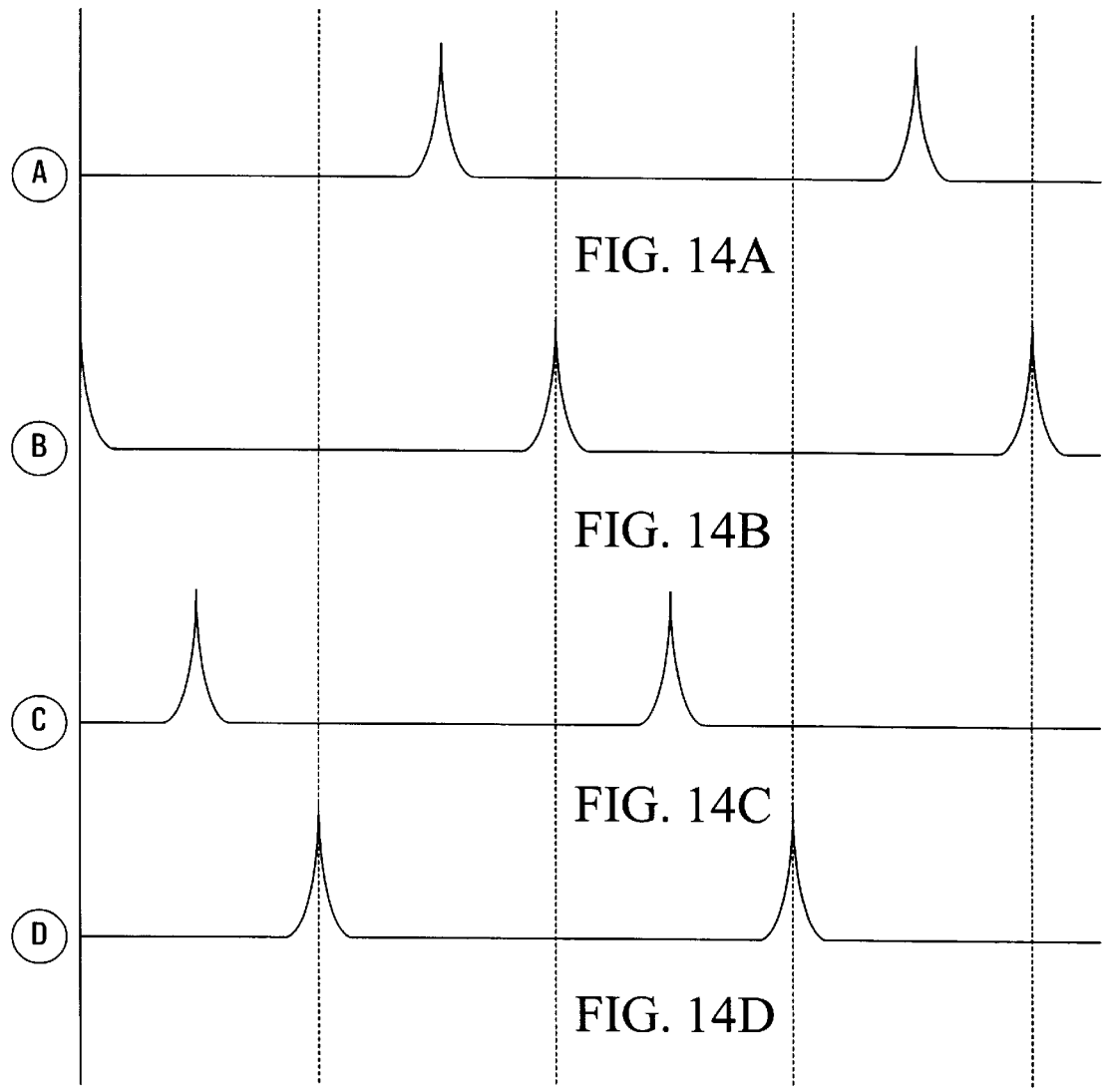
FIGS. 14A, 14B, 14C and 14D are graphical illustrations of possible voltage waveforms generated by the respective step recovery diodes within FIG. 11B.

The oscillator design of FIGS. 11A and 11B comprises four ceramic coaxial resonators 400, each of the resonators having an electrical length of one quarter of a wavelength or, in other words, an electrical length of 90°. As will be described below, the wavelength corresponding to the electrical length is inversely proportional to one quarter of the oscillator's output frequency. Each of these resonators 400 is similar in structure to the coaxial resonator depicted in FIG. 6D, that is each resonator comprises electrical connectors attached to either end. In this case, an electromagnetic wave can traverse the resonator 400 from one electrical connector to the other with a phase shift being introduced of 90°. As depicted in FIG. 11A, the four resonators 400 are coupled in series within a ring configuration so as to introduce a total phase shift around the ring of 360°. In this ring configuration, the electrical connectors on either end of each resonator 400 are coupled to other electrical connectors of resonators 400 in series.

As shown in FIG. 11, an amplifier 402, coupled in series with a phase shifter 403, is further coupled in parallel with each resonator 400, thus resulting in a load being presented to each amplifier 402 consisting of the four resonators 400. Each of these combinations of an amplifier 402 and phase shifter 403 is preferably designed to introduce a phase shift of approximately 90° between the input of the amplifier 402 and the output of the phase shifter 403 at a frequency corresponding to one quarter of the oscillator's output frequency. It is noted that the amplifier 402 and the phase shifter 403 could alternatively be in the opposite sequence or integrated into a single phase adjustable amplifying component. In general, the amplifier 402 or the amplifier 402 and phase shifter 403 combination can be referred to as an amplifying apparatus.

The phase shifters 403 are tuned to a particular phase shift that in turn can adjust the overall frequency of the oscillator within a predefined range defined by the physical length of the resonators used. In preferred embodiments, the phase shifters 403 are adjusted by the insertion of a tuning voltage $V_{TUNE}$ that modifies the phase shift presented by the amplifier 402/phase shifter 403 combination.

FIG. 12 is a schematic diagram of a phase shifter 403 according to one preferred embodiment. In this embodiment, the phase shifter 403 comprises two varactor diodes 450a, 450b with their anodes coupled together and further coupled via an inductor 452 to ground, and their cathodes coupled via coupling capacitors 454a,454b respectively to respective input/output nodes NODE1,NODE2 of the phase shifter 403. The input/output nodes NODE1,NODE2 are the respective input and output of the phase shifter 403, though it is recognized that they are interchangeable. The phase shifter 403 of FIG. 12 further comprises resistors 456a,456b that are coupled together at one end to an input terminal 458 for the tuning voltage $V_{TUNE}$ and coupled at the other end to respective cathodes of the varactor diodes 450a,450b; and a decoupling capacitor 460 coupled between the input terminal 458 for the tuning voltage $V_{TUNE}$ and ground. The coupling capacitors 454a,454b operate as dc blocking capacitors to prevent the varactor diode dc bias being applied to the resonator ring and amplifier outputs. The decoupling capacitor 460 operates to decouple the tuning voltage $V_{TUNE}$ at low frequencies in order to suppress noise on the tuning signal. In this embodiment, a positive tuning voltage $V_{TUNE}$ will result in both diodes 450a,450b being reverse biased. This in turn will result in an increase in their corresponding depletion regions and a decrease in their capacitance. Hence, the tuning voltage $V_{TUNE}$ can regulate the capacitance loading of signals traversing the phase shifter 403 and as a result control the phase shift for the amplifier 402/phase shifter 403 combination, this phase shift ultimately controlling the oscillation frequency for the overall oscillator.

For each amplifier 402/phase shifter 403 combination, there exists two feedback paths. The first feedback path includes the single 90° coaxial resonator 400 in shunt with the particular amplifier 402/phase shifter 403 combination, while the second feedback path includes the three other series connected coaxial resonators in shunt with the particular amplifier 402/phase shifter 403 combination. The combination of the three coaxial resonators in series introduces a phase shift of 270° between the input and output of the amplifier 402/phase shifter 403 combination. Since the combination of the amplifier 402 and the phase shifter 403 preferably also introduces a phase shift of approximately 90°, the total phase shift for a wave traversing the second feedback path is approximately 360°. An identical situation results for each of the other three amplifier/phase shifter combinations, that is a feedback path of 360° results from the set-up of FIG. 11A. Provided the combined gain of the amplifiers 402 exceeds the loss presented by the oscillation circuit as a whole, an oscillation condition within the resonators 400 can be established at a frequency range set by the physical dimensions of the coaxial resonators 400.

The use of four amplifiers 402 within the circuit of FIG. 11A ensures that an oscillation signal traversing the resonators 400 has consistently high power throughout the ring of resonators 400. It should be noted that even with the removal of one or more of the amplifier 402/phase shifter 403 combinations from the oscillator of FIG. 11A, the oscillation condition could still be met, as long as the combined gain of the remaining amplifiers 402 still exceeds the loss presented by the oscillator circuit as a whole. The reduction in the number of amplifiers 402 within the oscillator of FIG. 11A can reduce costs and in many cases will not result in a significant deterioration of the oscillation signal at any point within the ring of resonators 400.

As depicted in FIG. 11A, the oscillatory mode established in the ring of resonators 400 is sampled at each of four resonator connection nodes, those being nodes A through D in FIG. 11A. Each resonator connection node, A through D, is separated from the next by one of the 90° coaxial resonators. Thus, the phase shifts between the four signals sampled at the resonator connection nodes are factors of 90°. FIGS. 13A, 13B, 13C and 13D illustrate graphical depictions of possible voltage waveforms generated at nodes A through D respectively during the operation of the oscillator of FIG. 11A. As can be seen, the waveforms generated at the resonator connection nodes in one embodiment are clipped sinusoidal signals that are out-of-phase by 90°. This clipping can result from limitations within the amplifiers 402, such as possibly maximum/minimum values for power rails and/or transistors within the amplifiers 402 going into compression. The amplifiers 402, in this case, are all biased such that the clipping occurs on the same half of the cycle for the signals at all four resonator connection nodes A through D, that is either the positive or negative half cycle. In other cases, as will be described below, little or no clipping within the sampled signals is required.

As depicted in FIG. 11B, the oscillator further comprises four coupling capacitors 404 coupled between respective ones of the resonator connection nodes A through D and respective nodes 409; four bias resistors 405 coupled between a negative voltage source $-V_E$ and respective ones of the nodes 409; four decoupling capacitors 407 coupled between the ground rail and respective ones of the node 409; four impulse generation inductors 406 coupled between respective ones of the nodes 409 and respective nodes 411; four dc blocking capacitors 410 coupled between respective ones of the nodes 411 and a node 412; and four step recovery diodes that each have an anode coupled to the ground rail and a cathode coupled to respective ones of the nodes 411. Yet further, the node 412, which is coupled to each of the dc blocking capacitors 410, is further coupled to a tuned circuit 414 and, via a coupling capacitor 422, to an output terminal 424.

The tuned circuit 414 is preferably similar :o the tuned circuit 100 of FIG. 7, in this case comprising a capacitor 416, an inductor 418, and a resistor 420 coupled in parallel between the ground rail and the node 412. This tuned circuit 414 is tuned to the fourth harmonic frequency of the individual oscillation signals depicted within FIGS. 12A through 12D in order to suppress the fundamental frequency and select out the fourth harmonic of signals at node 412. Although, the tuned circuit 414 comprises a number of devices in parallel, this should not limit the scope of the present invention. Alternatively, other circuits that have a specific tuned frequency could be utilized such as a single inductor or a quarter wave resonant line.

In the preferred embodiment of the present invention depicted in FIG. 11, the impulse generation inductors 406 and step recovery diodes 408 operate in combination as comb function generators. The voltage pulse trains generated by the step recovery diodes are applied to the tuned circuit 414 which selects out the desired harmonic. The result of this operation is significantly more narrowly defined voltage peaks within the oscillation signals at the nodes 411 than the minimum dips that were illustrated within FIGS. 13A through 13D for nodes A through D respectively. FIGS. 14A, 14B, 14C and 14D illustrate possible waveforms of FIG. 13A through 13D respectively after a step recovery operation has been performed.

It is noted that when using the step recovery diodes 408, the clipping illustrated within FIGS. 13A through 13D can be reduced or eliminated since the differentiation between voltage peaks is sufficiently distinct. This reduction in clipping can allow for the loading on the resonators 400 to be reduced leading to an increase in the loaded Q of the resonators 400 which results in a decrease in the phase noise of the resultant oscillator.

The four oscillation signals that are depicted in FIGS. 14A through 14D are combined at node 412. In this case, as described previously, the tuned circuit 414 preferably significantly suppresses the fundamental and harmonic signals generated during the combination, with the exception of the fourth harmonic. In this manner, the frequency of the resulting combination has a frequency four times that of the oscillatory mode established in the resonator ring. A sample combination result at node 412 is illustrated in FIG. 15A for the combination of the waveforms depicted within FIGS. 14A through 14D. Hence, the oscillator according to the preferred embodiment depicted in FIGS. 11A and 11B will have its output signal $S_{OSC}(t)$ operate at a frequency four times that which a traditional oscillator design could achieve with the same ceramic coaxial resonator.

Additionally, an oscillation signal generated at one of the resonator connection nodes A through D could be used to sample an oscillation signal at one quarter the frequency compared to the oscillator's overall output frequency. This is illustrated within FIG. 11B at node D. In this case, a coupling capacitor 426 couples node D to a second output terminal 428 which can be used to send a lower frequency feedback signal $S_{OSC_1}(t)$ to the PLL synthesizer chip, this lower frequency feedback signal being a quarter of the output frequency at terminal 424.

Although the preferred embodiment of the present invention described above with reference to FIG. 11B utilizes step recovery diodes 408 to improve the efficiency of fourth harmonic generation and reduce the need for clipping at the amplifiers 402, such diodes are not required. For instance, the oscillation signals at the resonator connection nodes A through D as depicted within FIGS. 13A through 13D could be combined at node 412 without the step recovery operation. A sample waveform that could be generated with such a combination is depicted in FIG. 15B. In this case, the voltage peaks are not as well defined but are still satisfactory. The advantages of not using the step recovery diodes relate to the reduction in costs and physical space while the advantages of using the step recovery diodes concern the increased efficiency that results due to the well-defined voltage peaks that can be applied to the output resonant circuit.

The preferred embodiment of the present invention described above is specific for the use of four resonators, each having a corresponding amplifier and phase shifter, that when configured in a ring set-up generate four quadrature signals. These quadrature signals, when combined, quadruple the frequency of a well-known oscillator using a coaxial resonator of identical dimensions. It should be understood though that the present invention could be expanded beyond this particular implementation and could apply to ring set-ups with more or fewer coaxial resonators and/or amplifier/phase shifter combinations. In one case, there could simply be three resonators with at least one of the resonators having an amplifier/phase shifter combination coupled in parallel. In that case, each of the resonators would preferably have an electrical length of 120° and the amplifier(s) combined with the phase shifter(s) would each have a phase shift of approximately 120°. In general, the number of resonators can be expanded from three to four or more, as long as the total electrical length of the ring is 360° and the combined gain of the amplifiers is greater than the losses within the overall oscillation circuit. Preferably, for the case that there are N coaxial resonators, the electrical lengths for each individual coaxial resonator equals 360° divided by N. Further, the phase shift of the amplifier/phase shifter combinations are preferably each approximately 360° over N though this can be adjusted by the tuning voltage $V_{TUNE}$ in preferable embodiments. In this case, the frequency of the overall oscillator, after N sampled oscillation signals are combined, would be N times the frequency of a typical oscillator using a ceramic coaxial resonator of the same dimensions.

It is noted that the implementation of two resonators will not operate ideally and that implementations with more than four coaxial resonators will have an increasing need for the step recovery diodes implemented within the preferred embodiment of FIGS. 11A and 11B. It is further noted, as mentioned above, that the amplifier and the phase shifter could be combined into a single apparatus or alternatively no phase shifter could be implemented at all as is described below for oscillators that are not voltage controlled.

A key advantage of the present invention is the possibility of increasing an oscillation frequency beyond the physical limitation commonly thought for a ceramic coaxial resonator while still utilizing a ceramic coaxial resonator. If utilized within a push-push oscillation design and the system further has a subharmonically pumped mixer for doubling the frequency, the present invention can increase the range of use for a VC-CRO from approximately 20 GHz (5×2×2) to approximately 40 GHz (5×2×2×2). Similarly, if utilized within a ring oscillation design of FIGS. 11A and 11B and the system further has a subharmonically pumped mixer for doubling the frequency, the present invention can also increase the range of use for a VC-CRO to approximately 40 GHz (5×4×2). If more than four resonators are used, as described above, the frequency of oscillation can be increased yet further.

This expansion in frequency allows high frequency applications such as LMDS applications to achieve the required frequency while still using the advantageous ceramic coaxial resonators. All of the advantages of the ceramic coaxial resonators as described herein above are advantages of the present invention, especially when considering applications requiring frequencies higher than 20 GHZ. In terms of the LMDS applications, the DRO at a present cost of approximately $500–600 can be replaced with a ring oscillator as depicted. in FIGS. 11A and 11B at a cost less than $20, assuming a subharmonically pumped mixer or doubler is implemented within the system.

Figure 2:
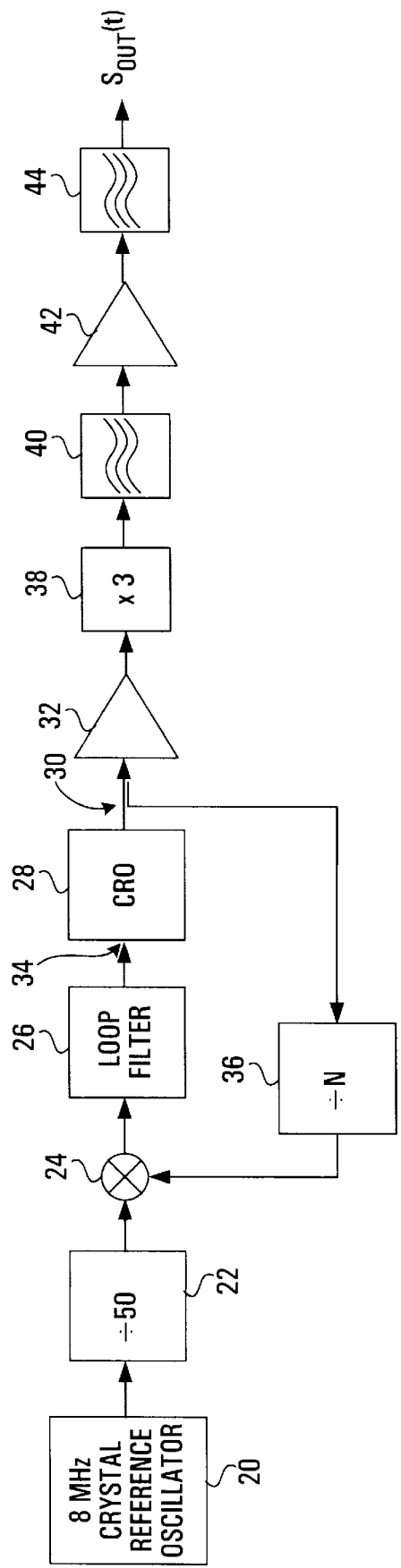
FIG. 2 is a block diagram illustrating the well-known PLL-FS configuration of FIG. 1 with an additional frequency multiplication stage.

Even if the increase in frequency resulting from an implementation of the present invention does not remove the need for a frequency multiplication stage such as that illustrated in FIG. 2, there can still be advantages if the frequency multiplication factor required is reduced. This is generally because the conversion efficiency of a multiplication stage is typically one over the multiplication factor. Further, there are two commonly used techniques for implementing multipliers with varying disadvantages. For multiplication stages that require only a doubling of frequency, a relatively low phase noise Schottky Barrier diode can be used while if large frequency multiplication operations are needed, step recovery diodes are typically needed which increase the overall phase noise for the PLL-FS. In this case of a step recovery diode being used as a multiplication stage, a plurality of the harmonics within the voltage pulse train generated by the step recovery diode are "picked off" by a tuned circuit in order to increase the frequency.

A further advantage of the preferred embodiment of the present invention depicted in FIGS. 11A and 11B and to a lesser extent the push-push oscillator design results from the low frequency signal that can be sampled for feedback. The reduction in the minimum frequency that can be sampled from the oscillator design can, as discussed previously, significantly reduce the need for external dividers within a PLL-FS implementation, and hence reduce the phase noise, cost and physical size that are associated with such external frequency dividers. Although preferably the external dividers are removed from PLL-FS according to embodiments of the present invention, it is noted that in other embodiments such dividers are still used with the division factor reduced.

A yet further advantage of the preferred embodiment of the present invention depicted in FIGS. 11A and 11B concerns a reduction in tuning bandwidth that is achievable relative to traditional VCO designs. It can be seen that a change within the tuning voltage of N KHz on one of the amplifiers 402 would have the same result on the output frequency as a change within the tuning voltage of 4×N KHz within a traditional VCO such as that depicted in FIG. 4. This is an advantage for the ring oscillation configuration of FIGS. 11A and 11B since the tuning bandwidth of the oscillator has essentially been decreased which results in a corresponding decrease in the phase noise for the oscillator.

It should be understood that although the present invention can be utilized by a system using a ceramic coaxial resonator to raise the oscillation frequency to levels above 20 GHz, the present invention can also be utilized in implementations requiring lower frequencies. The present invention does not have to be operated with the minimum size ceramic coaxial resonator or with any other frequency doubling techniques. There are possible advantages of the present invention even at these lower frequencies when compared to other oscillator designs. For instance, there are advantages to using larger resonators within the oscillator design of FIG. 7 rather than using a resonator a quarter the size within a standard CRO as depicted in FIG. 4. For one, the resonator Q factor can be increased by using a physically larger sized resonator that can store an increased amount of energy. When using larger resonators in the ring oscillator architecture of preferred embodiments of the present invention and then using the technique discussed above to double the frequency to the level of interest, the Q level for the resonators improve and the phase noise can subsequently be reduced. Secondly, a current disadvantage with balanced or push-push oscillator designs described above is that a shared isolated ground plane is required to allow for a floating ground for the resonators to be generated during operation. The need for the isolated ground plane is a disadvantage the preferred embodiments of the present invention depicted within FIGS. 11A and 11B does not have since the resonators of FIGS. 11A and 11B do not require such a grounding. Further, the lack of an isolated ground plane allows the outside of the resonators according to preferred embodiments of the present invention to be grounded which increases its ability to be manufactured.

The preferred embodiments of the present invention were described as VC-CROs. It should be recognized that with the removal of the phase shifters 403 within FIG. 11A, the oscillator is simply a CRO with no voltage control. In this case, the amplifying apparatus would only include the amplifiers 402.

Although the oscillator circuits of the present invention described herein above are operating at the fundamental mode of the resonators, the circuits could alternatively be designed to sustain oscillations at higher order modes of the resonators.

Persons skilled in the art will appreciate that there are yet more alternative implementations and modifications possible for implementing the present invention, and that the above implementation is only an illustration of this embodiment of the invention. The scope of the invention, therefore, is only to be limited by the claims appended hereto.

We claim:

1. An oscillation circuit comprising:

N coaxial resonators, each of the coaxial resonators with first and second electrical connectors coupled at respective first and second opposite ends of the coaxial resonator, N being greater than two; and at least one amplifying apparatus, having a phase shift from input to output, that is coupled in parallel with one of the N coaxial resonators, the combined gain of the at least one amplifying apparatus being greater than a loss for the oscillation circuit;

wherein the coaxial resonators are coupled in series within a ring such that the total electrical length of the coaxial resonators in the ring equals 360°.

2. An oscillation circuit according to claim 1, wherein the phase shift corresponding to the at least one amplifying apparatus is approximately equal to the electrical length of the coaxial resonator it is in parallel with.

3. An oscillation circuit according to claim 1, wherein the at least one amplifying apparatus comprises an amplifier that receives a tuning signal to adjust the phase shift corresponding to the amplifying apparatus.

4. An oscillation circuit according to claim 1, wherein the at least one amplifying apparatus comprises an amplifier and a phase shifter coupled in series, the phase shifter receiving a tuning signal that adjusts the phase shift corresponding to the amplifying apparatus.

5. An oscillation circuit according to claim 1, wherein the at least one amplifying apparatus comprises N amplifying apparatus, each of the N amplifying apparatus being coupled in parallel with a respective one of the N coaxial resonators, the combined gain of the N amplifying apparatus being greater than a loss for the oscillation circuit.

6. An oscillation circuit according to claim 5, wherein the phase shift corresponding to each of the N amplifying apparatus is approximately equal to the electrical length of its respective coaxial resonator.

7. An oscillation circuit according to claim 5, wherein each of the N amplifying apparatus comprises an amplifier that receives a tuning signal to adjust the phase shift corresponding to the particular amplifying apparatus.

8. An oscillation circuit according to claim 5, wherein each of the N amplifying apparatus comprises an amplifier and a phase shifter coupled in series, the phase shifter receiving a tuning signal that adjusts the phase shift corresponding to the particular amplifying apparatus.

9. An oscillation circuit according to claim 1, wherein, in operation, an oscillation signal is sampled from at least one node between two of the coaxial resonators.

10. An oscillation circuit according to claim 1, wherein each of the N coaxial resonators has an electrical length of 360° divided by N.

11. An oscillation circuit according to claim 10, wherein N is equal to three, each of the coaxial resonators has an electrical length of 120°, and the phase shift for each of the amplifiers is approximately 120°.

12. An oscillation circuit according to claim 10, wherein N is equal to four, each of the coaxial resonators has an electrical length of 90°, and the phase shift for each of the amplifiers is approximately 90°.

13. An oscillation circuit according to claim 10 further comprising N connection nodes, each of the connection nodes being coupled between a different two of the coaxial resonators;

wherein, in operation, one of N oscillation signals is sampled from each one of the N connection nodes, the N oscillation signals being at a common frequency but out-of-phase by 360° divided by N.

14. An oscillation circuit according to claim 13 further comprising N coupling capacitors comprising first ends coupled to respective ones of the N connection nodes and second ends coupled together at a shared node which is further coupled to a tuned circuit tuned to the Nth harmonic;

whereby an output oscillation signal at an output frequency N times that of the common frequency is generated at the shared node in operation.

15. An oscillation circuit according to claim 14, wherein one of the connection nodes is coupled to a feedback node via a feedback coupling capacitor and the common node is coupled to an output node via an output coupling capacitor.

16. An oscillation circuit according to claim 14, wherein the at least one amplifying apparatus receives a tuning signal that adjusts its phase shift.

17. A Phase Locked Loop-Frequency Synthesizer (PLL-FS), incorporating an oscillation circuit according to claim 16, comprising:

a crystal resonant oscillator that generates a first oscillation signal;

a Phase Locked Loop (PLL) synthesizer component, coupled to the crystal resonant oscillator, that receives the first oscillation signal and a feedback oscillation signal, and generates an error signal;

a loop filter, coupled to the PLL synthesizer component, that receives and filters the error signal leaving only the baseband signal within a filtered signal; and the oscillation circuit, coupled to the loop filter, that receives the filtered signal as the tuning signal, outputs the output oscillation signal at the output frequency, and further outputs one of the N oscillation signals at the common frequency as the feedback oscillation signal.

18. A PLL-FS according to claim 17 further comprising an amplifier, coupled to the oscillation circuit, that receives the output oscillation signal and amplifies it to generate an amplified output signal for the PLL-FS.

19. A Phase Locked Loop-Frequency Synthesizer (PLL-FS), incorporating an oscillation circuit according to claim 16, comprising:

- a crystal resonant oscillator that generates a first oscillation signal;
- a Phase Locked Loop (PLL) synthesizer component, coupled to the crystal resonant oscillator, that receives the first oscillation signal and a feedback oscillation signal, and generates an error signal;
- a loop filter, coupled to the PLL synthesizer component, that receives and filters the error signal leaving only the baseband signal within a filtered signal;
- the oscillation circuit, coupled to the loop filter, that receives the filtered signal as the tuning signal and outputs the output oscillation signal at the output frequency and one of the N oscillation signals at the common frequency; and
- a frequency divider, coupled between the oscillation circuit and the PLL synthesizer component, that receives the one of the N oscillation signals and reduces its frequency to generate the feedback oscillation signal.

20. An oscillation circuit according to claim 13 further comprising N first capacitors coupled to the respective ones of the N connection nodes and further coupled in series with respective ones of N inductors and N second capacitors, the N second capacitors further being coupled together at a shared node which is further coupled to a tuned circuit tuned to the Nth harmonic;

wherein the oscillation circuit further comprises N step recovery diodes comprising an anode coupled to a low power terminal and a cathode coupled between respective ones of the N inductors and N second capacitors;

whereby an output oscillation signal at an output frequency N times that of the common frequency is generated at the shared node in operation.

21. An oscillation circuit according to claim 20 further comprising N third capacitors, each of the third capacitors being coupled between the low power terminal and a respective node between one of the first capacitors and its respective inductor.

22. An oscillation circuit according to claim 20 further comprising N resistors, each of the resistors being coupled between a second low power terminal and a respective node between one of the first capacitors and its respective inductor, the second low power terminal being at a lower power than the first low power terminal.

23. An oscillation circuit according to claim 20, wherein one of the connection nodes is coupled to a feedback node via a feedback coupling capacitor and the common node is coupled to an output node via an output coupling capacitor.

24. An oscillation circuit according to claim 20, wherein the at least one amplifying apparatus receives a tuning signal that adjusts its phase shift.

25. A Phase Locked Loop-Frequency Synthesizer (PLL-FS), incorporating an oscillation circuit according to claim 24, comprising:

- a crystal resonant oscillator that generates a first oscillation signal;
- a Phase Locked Loop (PLL) synthesizer component, coupled to the crystal resonant oscillator, that receives the first oscillation signal and a feedback oscillation signal, and generates an error signal;
- a loop filter, coupled to the PLL synthesizer component, that receives and filters the error signal leaving only the baseband signal within a filtered signal; and
- the oscillation circuit, coupled to the loop filter, that receives the filtered signal as the tuning signal, outputs the output oscillation signal at the output frequency, and further outputs one of the N oscillation signals at the common frequency as the feedback oscillation signal.

26. A PLL-FS according to claim 25 further comprising an amplifier, coupled to the oscillation circuit, that receives the output oscillation signal and amplifies it to generate an amplified output signal for the PLL-FS.

27. A Phase Locked Loop-Frequency Synthesizer (PLL-FS), incorporating an oscillation circuit according to claim 24, comprising:

- a crystal resonant oscillator that generates a first oscillation signal;
- a Phase Locked Loop (PLL) synthesizer component, coupled to the crystal resonant oscillator, that receives the first oscillation signal and a feedback oscillation signal, and generates an error signal;
- a loop filter, coupled to the PLL synthesizer component, that receives and filters the error signal leaving only the baseband signal within a filtered signal;
- the oscillation circuit, coupled to the loop filter, that receives the filtered signal as the tuning signal and outputs the output oscillation signal at the output frequency and one of the N oscillation signals at the common frequency; and
- a frequency divider, coupled between the oscillation circuit and the PLL synthesizer component, that receives the one of the N oscillation signals and reduces its frequency to generate the feedback oscillation signal.

* * * * *